United States Patent
Ha et al.

(10) Patent No.: US 7,505,535 B2
(45) Date of Patent: Mar. 17, 2009

(54) METHOD AND APPARATUS FOR CONTROLLING TURBO DECODER INPUT

(75) Inventors: Sang-Hyuck Ha, Suwon-shi (KR); Nam-Yul Yu, Suwon-shi (KR); Min-Goo Kim, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 798 days.

(21) Appl. No.: 10/718,816

(22) Filed: Nov. 24, 2003

(65) Prior Publication Data

US 2004/0117715 A1 Jun. 17, 2004

(30) Foreign Application Priority Data

Nov. 23, 2002 (KR) .................... 10-2002-0073280

(51) Int. Cl.
*H03D 1/00* (2006.01)
(52) U.S. Cl. ..................... 375/340; 375/316; 711/1
(58) Field of Classification Search ........... 375/340, 375/316, 377, 224, 226, 227, 228; 711/1, 711/2, 3, 5, 100, 157, 154, 200; 369/19, 369/24.01, 47.1, 59.1, 60.01, 272.1; 341/50, 341/81; 714/776, 749

See application file for complete search history.

(56) References Cited

U.S. PATENT DOCUMENTS 6,393,076 B1   5/2002   Fontaine et al.
6,624,767 B1 *  9/2003  Shiu et al. ............ 341/81
6,625,762 B1 *  9/2003  Le Dantec ............ 714/701
6,721,908 B1 *  4/2004  Kim et al. ............ 714/702
7,245,600 B2 *  7/2007  Chen ................... 370/335

FOREIGN PATENT DOCUMENTS

DE    102 14 393    2/2003

(Continued)

OTHER PUBLICATIONS

Qiang Wu, Eduardo Esteves, "The CDMA2000 High Rate Packet Data System", Internet Article, Online, Mar. 26, 2002, XP002303829.

(Continued)

*Primary Examiner*—Temesghen Ghebretinsae
(74) *Attorney, Agent, or Firm*—Roylance, Abrams, Berdo & Goodman, L.L.P.

(57) ABSTRACT

A method and apparatus for effectively controlling data input to a turbo decoder for decoding forward packet data traffic in a 1xEV-DV mobile station (MS) are disclosed. After received code symbols are stored in one of several memories and read in deinterleaving order, read addresses and chip select signals are generated for the memories based on encoder packet size in synchronization to a decoder clock signal. The decoding starts by inputting a predetermined number of code symbols to the turbo decoder in an appropriate order. The decoder input apparatus reads demodulated forward packet data from decoder input buffers in an appropriate order using the read addresses and chip select signals to generate turbo decoder input data in an appropriate form. Thus, a small-size, low-cost, low-power consumption MS is achieved by processing channel-interleaved data at high speed and with reduced process delay and providing them to a decoder.

40 Claims, 22 Drawing Sheets

FOREIGN PATENT DOCUMENTS

| | | |
|---|---|---|
| EP | 1 418 675 | 5/2004 |
| WO | WO 02/21715 | 3/2002 |

OTHER PUBLICATIONS

Pietrobon S.S., "Implementation and Performance of a Turbo/Map Decoder", International Journal of Satellite Communications, John Wiley and Sons, U.S., vol. 16, No. 1, 1998, pp. 23-46, XP000856961.

Berrou C. et al., "Near Optimum Error Correcting Coding and Decoding: Turbo-Codes", IEEE Transactions on Communications, IEEE, Inc. New York, U.S., vol. 48, No. 2, 1996, pp. 1261-1271, XP000919139.

Ryan W. William, Institute of Electrical and Electronics Engineers, "A Turbo Code Tutorial", IEEE Global Telecommunications Conference, Phoenix, Arizona, Nov. 3-8, 1997, Global Telecommunications Conference (GLOBECOM), New York, IEEE, U.S., vol. 1, 2001 pp. 1-9, XP001014550.

1xEV-DV Forward Link Overview, Internet Citation, Nov. 16, 2001, XP002247591.

R. Thomas Derryberry et al., Nokia Research Center, "CDMA2000 1x EVoled Data and Voice (1xEV-DV)", Internet Article, Online, Oct. 22, 2002, XP002321132.

* cited by examiner

For EP_SIZE(N_EP) = '000'(408),'001'(792), or '010'(1560)

125a

For EP_SIZE(N_EP) = '011'(2328)

125b

For EP_SIZE(N_EP) = 000(408),001(792), or 010(1560)

150a

For EP_SIZE(N_EP) = 011(2328)

150b    151

METHOD AND APPARATUS FOR CONTROLLING TURBO DECODER INPUT

PRIORITY

This application claims priority under 35 U.S.C. § 119 to an application entitled "Method and Apparatus for Controlling Turbo Decoder Input" filed in the Korean Intellectual Property Office on Nov. 23, 2002 and assigned Serial No. 2002-73280, the contents of which are incorporated herein by reference.

BACKGROUND OF THE INVENTION

1. Field of the Invention

The present invention relates generally to a high-speed packet data communication system, and in particular, to a method and apparatus for applying coded and interleaved data to the input of a turbo decoder.

2. Description of the Related Art

A W-CDMA (Wideband-Code Division Multiple Access) mobile communication system such as CDMA2000 and UMTS (Universal Mobile Telecommunication Service) uses turbo encoding and interleaving to reliably transmit multimedia data at a high rate. It is known that the turbo encoding exhibits very excellent information recovery performance in terms of bit error rate (BER) at a low Signal-to-Noise Ratio (SNR). The interleaving renders adjacent bits to be randomly influenced by fading in a fading environment, thus preventing burst errors and increasing the effect of the channel encoding.

According to an Evolution in Data and Voice (1xEV-DV) standard called CDMA2000 Release C on which the $3^{rd}$ Generation Partnership Project (3GPP and 3GPP2) are working, a base station (BS) classifies code symbols produced by channel-encoding a packet data stream in a channel encoder into subblocks of a predetermined size according to the types of the code symbols, and interleaves the respective subblocks. A mobile station (MS) recovers the code symbols by deinterleaving the interleaved symbols in the reverse order to the interleaving, and turbo-decodes the code symbols.

1xEV-DV provides that an encoder packet (EP) for the input of the turbo encoder in the BS is 408, 792, 1560, 2328, 3096, or 3864 bits and the maximum number of code symbols transmittable for one unit time of a forward packet data channel (F-PDCH) is limited to 7800. Moreover, code symbols of different types alternate with each other during transmission in order to maximize turbo decoding performance. To accurately recover the data transmitted in the above complicated procedure, a receiver needs buffers for respective operations, involving time delays in buffering.

Random Access Memories (RAMs) are used as these buffers in the MS receiver. In view of sequential input/output at each buffer, as the number of buffers increases, a total data processing time increases significantly. Therefore, efficient buffer management is a significant consideration to designing a MS receiver supporting high-speed data service. Hence, there is a need for a method of recovering turbo decoder input accurately and rapidly in a mobile communication system supporting high-speed data service.

SUMMARY OF THE INVENTION

An object of the present invention is, therefore, to provide a method and apparatus for channel-deinterleaving forward packet data traffic prior to decoding in a receiver of a 1xEV-DV communication system.

Another object of the present invention is to provide a method and apparatus for channel-deinterleaving forward packet data traffic using turbo decoder input buffers in a receiver of a 1xEV-DV communication system.

A further object of the present invention is to provide a method and apparatus for constructing turbo decoder input for forward packet data traffic in a 1xEV-DV MS.

Still another object of the present invention is to provide a method and apparatus for storing received code symbols, reading them sequentially, and feeding them to a decoder in a 1xEV-DV communication system.

The above objects are achieved by a decoder input controlling apparatus and method. According to one aspect of the present invention, in a mobile communication system where a transmitter encodes an EP including information bits and tail bits at a predetermined code rate and subblock-interleaves code symbols of a plurality of encoded subblocks prior to transmission, and a receiver receives the code symbols, stores the code symbols separately in first, second and third memories, reads the code symbols in a deinterleaving order corresponding to the interleaving, and provides the read code symbols to a turbo decoder having two constituent decoders, read addresses and chip select signals are generated for the memories using the size of the EP in synchronization to a decoder clock signal. Code symbols are then output to the two constituent decoders according to the read addresses and the chip select signals.

According to another aspect of the present invention, a transmitter has a first encoder for generating an information bit stream and a first tail bit stream with respect to the EP and generating a pair of parity bit streams corresponding to the information bit stream and the first tail bit stream, a second encoder for generating a second tail bit stream successive to the first tail bit stream and generating a pair of second parity bit streams corresponding to an interleaver output of the information bit stream and the second tail bit stream, a symbol separator for generating a first subblock having the information bit stream and the first and second tail bit streams, second and third subblocks having the pair of first parity bit streams corresponding to the information bit stream and the first and second tail bit streams, and fourth and fifth subblocks having the pair of second parity bits streams corresponding to the information bit stream and the first and second parity bit streams corresponding to the first and second tail bit streams, and a subblock interleaver for interleaving the respective subblocks. To provide at least parts of the sub-blocks received from the transmitter to a turbo decoder having two sequentially operated constituent decoders for decoding the EP from the parts of the sub-blocks, a first memory stores the information bit stream and the first and second tail bit streams of the first subblock. A second memory stores the first parity bit stream corresponding to the information bit stream and at least a part of the first and second tail bit streams in the second subblock, and selectively stores the second parity bit stream corresponding to the information bit stream and a part of the first and second parity bit streams corresponding to the first and second tail bit streams in the fifth subblock. A third memory stores the first parity bit stream corresponding to the information bit stream and at least a part of the first and second tail bit streams in the third subblock, and selectively stores the second parity bit stream corresponding to the information bit stream and at least a part of the first and second parity bit streams corresponding to the first and second tail bits streams in the fourth subblock. A decoder input apparatus reads a first code symbol from the first memory, reading a zero symbol instead of a second or third code symbol corresponding to the first code symbol if the second or third code symbol does not exist in the second or third memory, and providing the read symbols to the turbo decoder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein with reference to the accompanying drawings. In the following description, well-known functions or constructions are omitted for conciseness.

The present invention pertains to control of turbo decoder input to turbo-decode forward packet data traffic in a 1xEV-DV MS.

A description will first be made of structures and operations for transmitting a packet data stream and recovering a received data stream in a CDMA20001xEV-DV mobile communication system.

Figure 1:
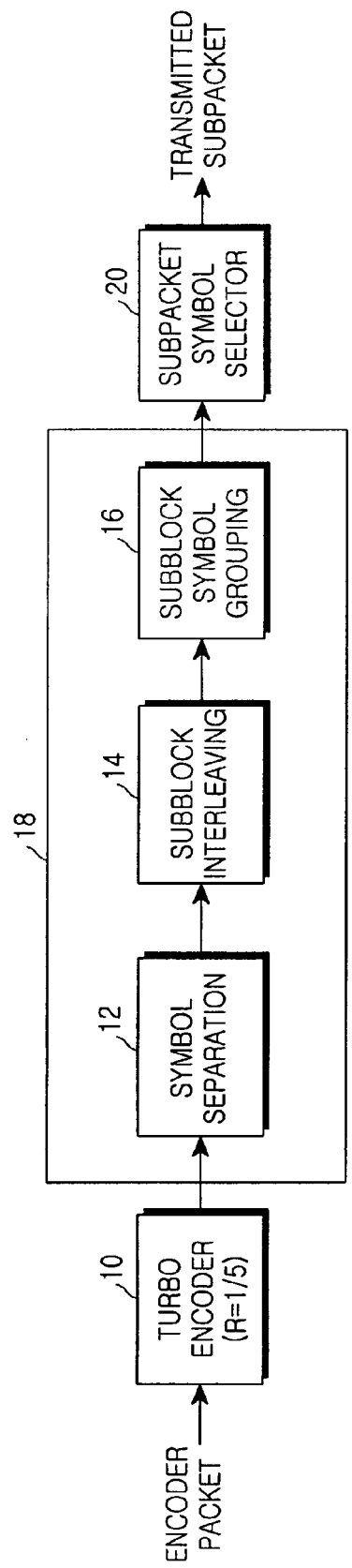
FIG. 1 is a block diagram of a BS transmitter for generating a transmission subpacket by interleaving F-PDCH packet data.

FIG. 1 is a block diagram of a BS transmitter for generating a transmission subpacket by interleaving packet data for an F-PDCH.

Referring to FIG. 1, a turbo encoder 10 encodes an input packet data stream in EP units at a predetermined code rate (R) and outputs code symbol sequences. The code symbols are divided into systematic symbols comprising transmission information and parity symbols comprising error correction information for use in data recovery according to the types of the code symbols.

If R is 1/5, the turbo encoder 10 outputs five code symbols for the input of each input information bit. It further outputs with a predetermined number of code symbols corresponding to virtually generated tail bits for convergence to a predetermined state at decoding. The virtual generation means that the tail symbols are output without actual input of the tail bits to the turbo encoder 10. In the 1 xEV-DV standard, six EP sizes are available: 408, 792, 1560, 2328, 3096, and 3864 bits, and six tail bits are generated for one EP. Consequently, the amount of actual information to be encoded is 402, 786, 1554, 2322, 3090, or 3858 bits.

A channel interleaver 18 permutes the order of the code symbols to ensure a high coding gain for the code symbols of a subpacket. A subpacket symbol selector 20 constructs a subpacket of a predetermined size using all or a part of the interleaved symbols.

The channel interleaver 18 is comprised of a symbol separator 12, a subblock interleaver 14, and a subblock symbol grouper 16. In operation, the symbol separator 12 classifies the code symbols received from the turbo encoder 10 into subblocks according to the types of the code symbols, and the subblock interleaver 14 interleaves the respective subblocks according to the same interleaving rule. The subblock symbol grouper 16 alternately arranges the interleaved symbols of the subblocks. The operation of the channel interleaver 18 will be described later in more detail.

An MS achieves decoded data by performing the operation of the BS transmitter in the reverse order on the high-speed packet data received from the BS transmitter on the F-PDCH.

Figure 2:
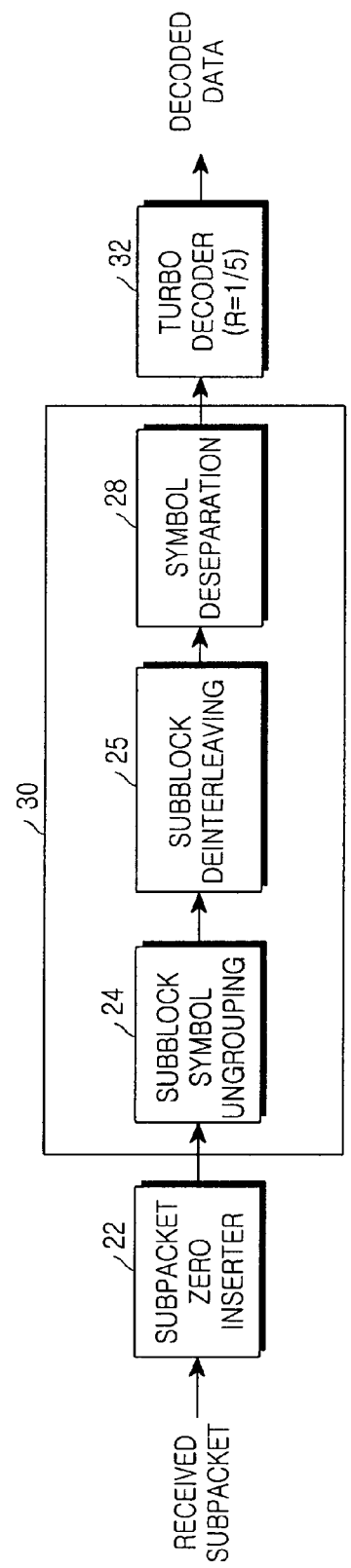
FIG. 2 is a block diagram of an MS receiver for obtaining decoded data from a subpacket received on the F-PDCH.

FIG. 2 is a block diagram of an MS receiver for obtaining decoded data from a subpacket received on the F-PDCH.

Referring to FIG. 2, a subpacket zero inserter 22 inserts zero code symbols "0" in predetermined positions of the subpacket in correspondence with the subpacket symbol selector 20 of the BS transmitter. A channel deinterleaver 30, being a counterpart of the channel interleaver 18, deinterleaves the output of the subpacket zero inserter 22 by sequentially performing subblock symbol ungrouping, subblock deinterleaving, and symbol deseparation.

A subblock symbol ungrouper 24 divides the output of the subpacket zero inserter 22 into five interleaved subblocks according to symbol types. A subblock deinterleaver 26 deinterleaves the subblocks according to a deinterleaving rule corresponding to the interleaving rule of the BS transmitter. A symbol deseparator 28 combines the interleaved subblocks. A turbo decoder 32 decodes the combined code symbols at the same code rate as used in channel encoder 10 of the BS transmitter.

Figure 3:
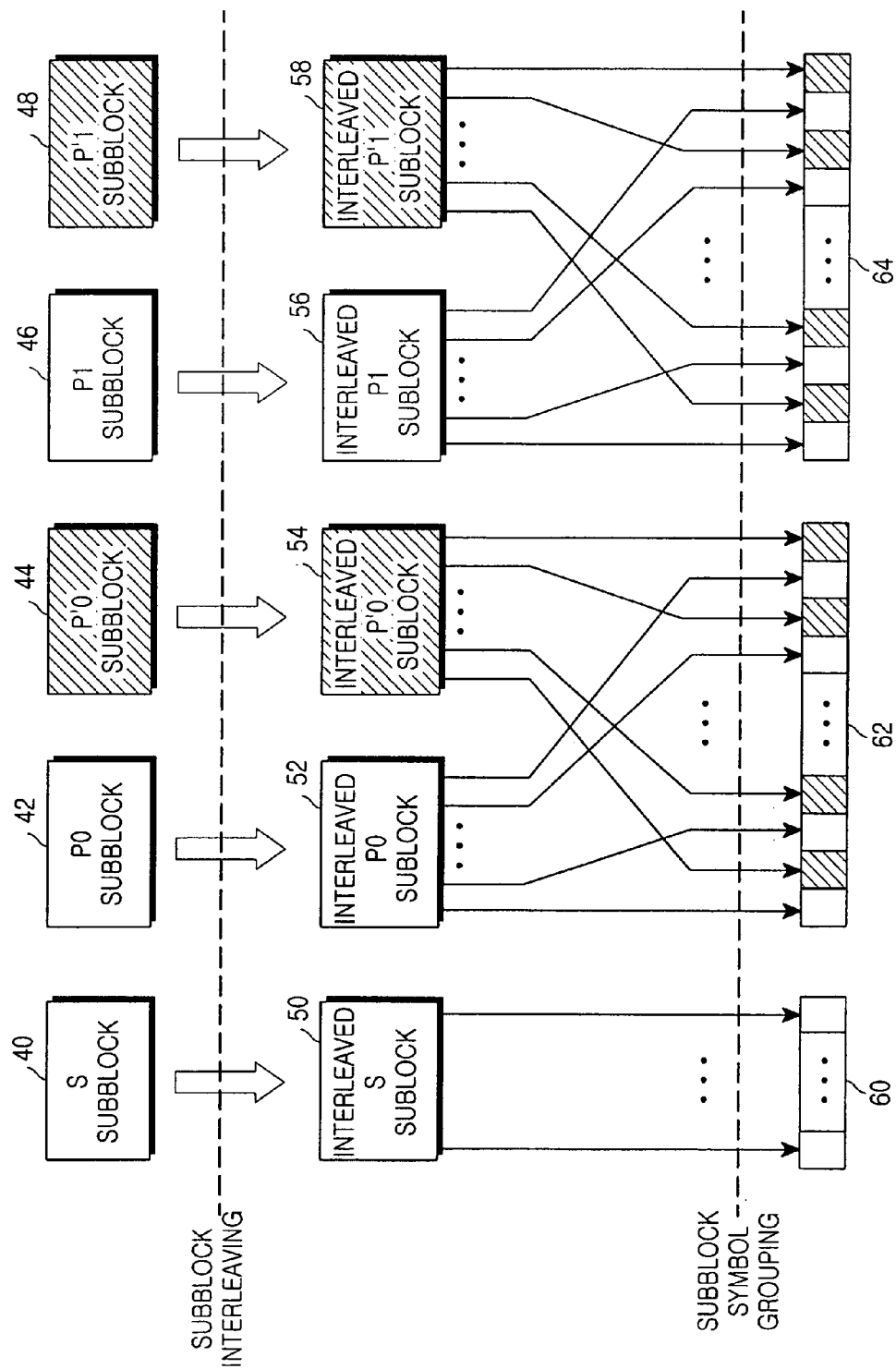
FIG. 3 illustrates channel interleaving performed by the BS transmitter in FIG. 1 in detail.

FIG. 3 illustrates the channel interleaving in the channel interleaver 18 in detail.

Referring to FIG. 3, the symbol separator 12 separates the code symbols from the turbo encoder 10 into five subblocks 40, 42, 44, 46 and 48 (i.e. S, P0, P'0, P1 and P'1). Each of the subblocks has as many code symbols as an EP size. Here, S is a systematic subblock and P0, P'0, P1 and P'1 are parity subblocks. The subblock interleaver 14 interleaves the respective subblocks according to the interleaving rule. The subblock symbol grouper 16 alternately arranges the code symbols of the interleaved parity subblocks 52, 54, 56 and 58. That is, a first data group 62 is produced by alternating the code symbols of the interleaved subblocks 52 and 54 (P0 and P'0), and a second data group 64 is produced by alternating the code symbols of the interleaved subblocks 56 and 58 (P1 and P'1). The interleaved systematic subblock 50 forms a systematic data group 60 without any change.

As described above, the code symbols from the channel encoder 10 are interleaved in a complex procedure involving subblock separation, subblock interleaving, and subblock symbol grouping. To decode the code symbols by symbol ungrouping, subblock deinterleaving and symbol deseparation, the receiver needs buffers for the respective operations and thus the total processing time is lengthened. In this context, according to the present invention, each time the receiver receives a subpacket, it stores the code symbols of the subpacket in a buffer, reads them in the output order of the turbo encoder 10 such that subblock ungrouping, subblock deinterleaving and symbol deseparation occur, and then feeds the read code symbols to a turbo decoder.

For better understanding of the present invention, the structure of a transmission subpacket will be described, taking a simple example.

Figure 4:
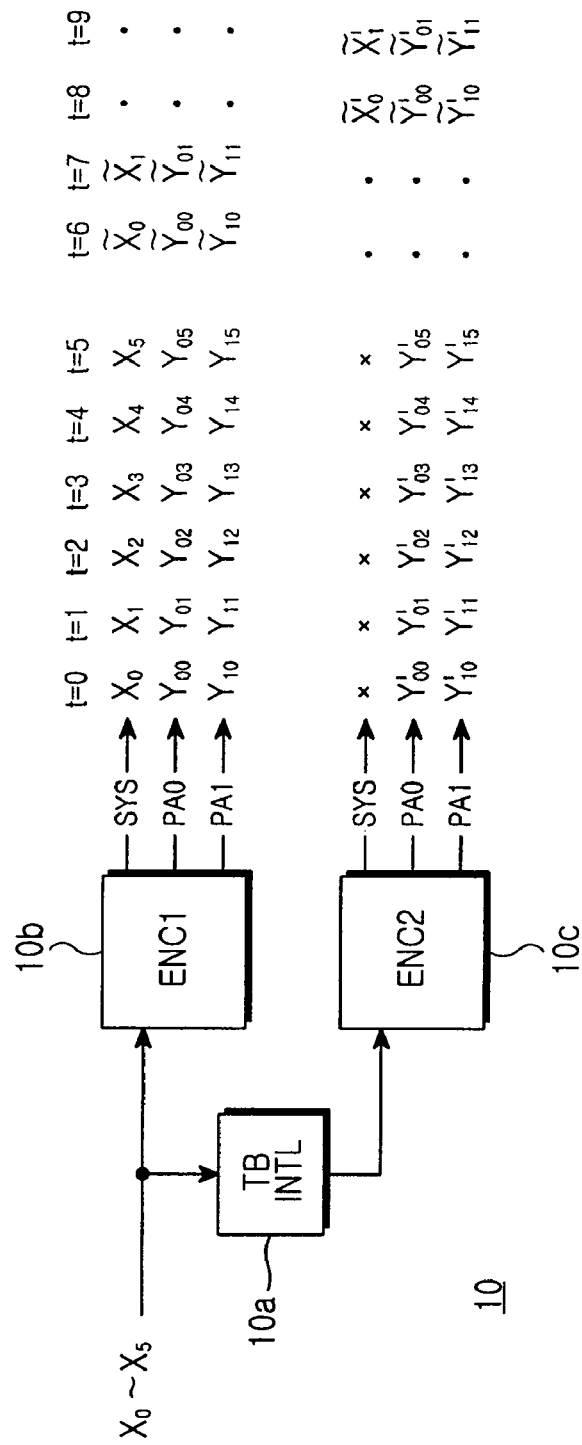
FIG. 4 illustrates the structure of a turbo encoder with a mother code rate of 1/5 and an example of turbo encoder output.

FIG. 4 is a detailed block diagram of the turbo encoder 10 with a mother code rate of 1/5, illustrating code symbols output from the turbo encoder 10. The mother code rate is a common code rate before processing in the subpacket symbol selector 20. It is set as 1/5 according to the 1xEV-DV standard. It is assumed herein that input data is six bits and four tail bits are virtually generated, that is, an EP size for the turbo encoder 10 is 10 bits.

Referring to FIG. 4, the turbo encoder 10 includes a turbo interleaver (TB INTL) 10a and first and second constituent encoders 10b and 10c (ENC1 and ENC2). Each of ENC1 and ENC2 encodes input information bits $X_0$ to $X_5$ at a code rate of 1/3 in synchronization to a clock signal t, and outputs one systematic symbol (SYS) and two parity symbols (PA0 and PA1). Then ENC1 and ENC2 each encode two tail bits. Code symbols from the tail bits are expressed as tilde X.

In FIG. 4, X denotes a code symbol immediately deleted after being output, and (•) denotes a code symbol that is not output. At time t=0 through t=5, systematic symbols are immediately deleted after being output from ENC2. No code symbols are output from ENC2 at t=6 and t=7, while no code symbols are output from ENC1 at t=8 and t=9.

Hence, a total of 36 code symbols are output from the turbo encoder 10, that is, 30 (or 6×5) code symbols for the input of 6 information bits and 12 (or 4×3) code symbols for the input of 4 tail bits. However, since 50 code symbols need to be output for the input of the 10 bits (that is, 6 information bits+4 tail bits) to meet the mother code rate of 1/5, systematic symbols are duplicated twice in response to each clock signal at each time of t=6 through t=9, thereby outputting three systematic symbols. That is, systematic symbols $X_0$ and $X_1$ output from ENC1 occur three times at t=6 and t=7, and systematic symbols $X'_0$ and $X'_1$ output from ENC2 occur three times at t=8 and t=9.

Figure 5:
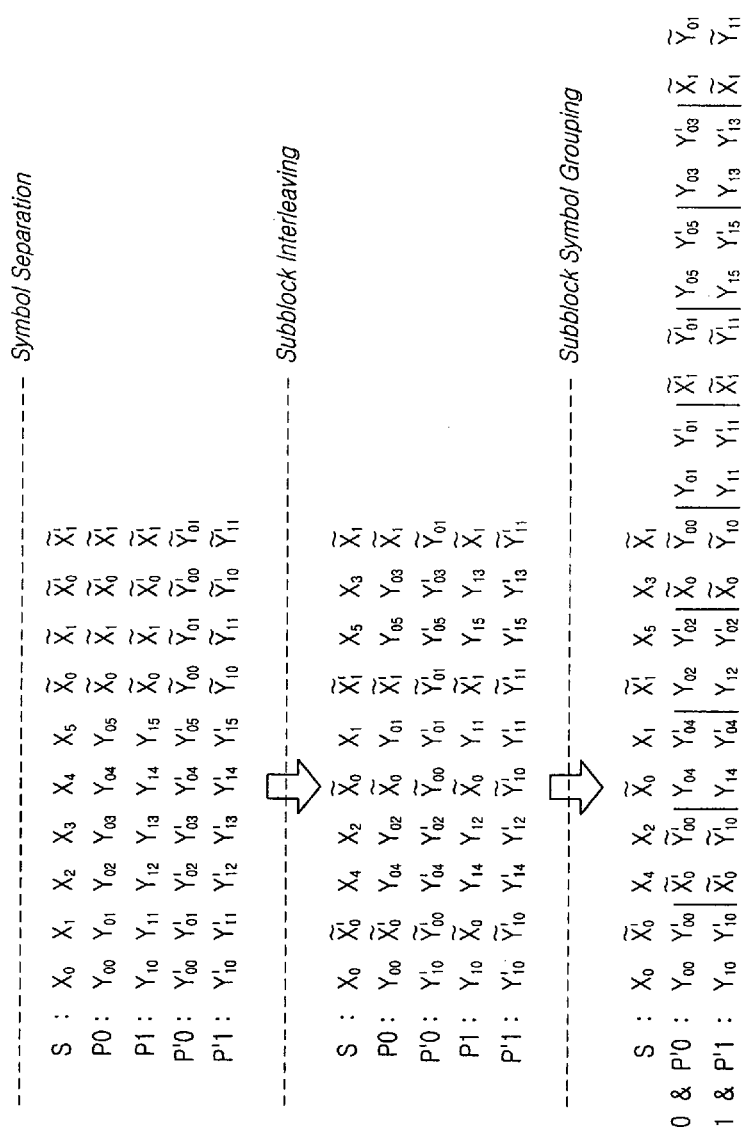
FIG. 5 illustrates channel interleaving of the turbo encoder output illustrated in FIG. 4.

FIG. 5 illustrates in detail the interleaving of the code symbols output from the turbo encoder 10 illustrated in FIG. 4.

Referring to FIG. 5, the code symbols from the turbo encoder 10 are separated into the five subblocks S, P0, P1, P'0 and P'1 according to symbol types. The subblock S contains SYS code symbols $X_0$ to $X_5$ output from ENC1 for the input of the information bits, SYS code symbols $X_0$ and $X_1$ output from ENC1 for the input of tail bits, and SYS code symbols $X'_0$ and $X'_1$ output from ENC2 for the input of the other tail bits.

The subblock P0 contains PA0 code symbols $Y_{00}$ to $Y_{05}$ output from ENC1 for the input of the information bits, the SYS code symbols $X_0$ and $X_1$ from ENC1, and the SYS code symbols $X'_0$ and $X'_1$ from ENC2. The subblock P1 contains PA0 code symbols $Y_{10}$ to $Y_{15}$ output from ENC1 for the input of the information bits, the SYS code symbols $X_0$ and $X_1$ from ENC1, and the SYS code symbols $X'_0$ and $X'_1$ from ENC2.

The subblock P'0 contains PA0 code symbols $Y'_{00}$ to $Y'_{05}$ output from ENC2 for the input of the information bits, PA0 code symbols $\tilde{Y}'_{00}$ and $\tilde{Y}'_{01}$ output from ENC1 for the input of the tail bits, and PA0 code symbols $\tilde{Y}'_{00}$ and $\tilde{Y}'_{01}$ output from ENC2 for the input of the other tail bits. The subblock P'1 contains PA1 code symbols $Y'_{10}$ to $Y'_{15}$ output from ENC2 for the input of the information bits, PA1 code symbols $\tilde{Y}'_{10}$ and $\tilde{Y}'_{11}$ output from ENC1 for the input of the tail bits, and PA1 code symbols $\tilde{Y}'_{10}$ and $\tilde{Y}'_{11}$ output from ENC2 for the input of the other tail bits.

Due to the SYS code symbols for the tail bits, some subblocks contain a part of the code symbols of a different type. That is, while the subblock S contains SYS code symbols from ENC1 and ENC2, the subblock P0 further contains SYS symbols from ENC1 and ENC2, the subblock P1 further contains SYS symbols from ENC1 and ENC2, the subblock P'0 further contains PA0 symbols form ENC1, and the subblock P'1 further contains PA1 symbols from ENC1.

The sequence of the code symbols in each of the subblocks is permuted by subblock interleaving. In FIG. 5, the code symbols arranged in an ascending order of 0, 1, 2, 3, 4, 5, 6, 7, 8, 9 in the subblock are rearranged in the order of 0, 8, 4, 2, 6, 1, 9, 5, 3, 7 by the subblock interleaving.

By subblock symbol grouping, the interleaved code symbols of the subblock P0 alternate with those of the subblock P'0, thus forming a P0/P'0 data group, while the interleaved code symbols of the subblock P1 alternate with those of the subblock P'1, thus forming a P1/P'1 data group. The code symbols of the S, P0/P'0 and P1/P'1 groups are sequentially fed to a modulator. The modulator modulates them and Radio Frequency (RF) module transmits the modulated symbols through an antenna by a carrier.

The receiver downconverts the RF signal received through an antenna to a baseband signal and recovers the code symbols by demodulating the baseband signal in a demodulator. The recovered code symbols are stored in a decoder input buffer prior to decoding. The decoder input buffer stores the code symbols in the form of the groups illustrated in FIG. 5.

Figure 6:
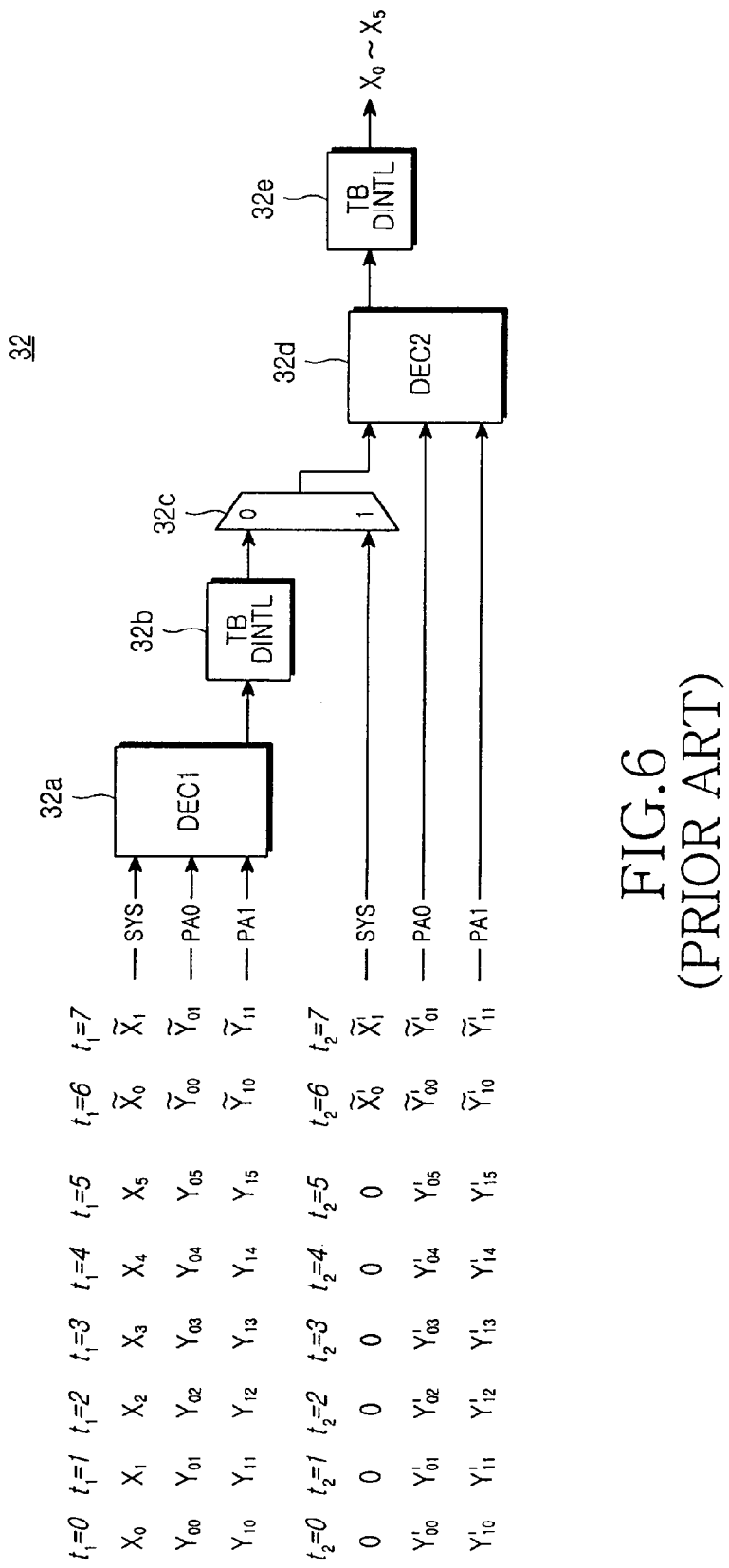
FIG. 6 illustrates the structure of a turbo decoder with a mother code rate of 1/5 and an example of turbo decoder input.

FIG. 6 is a block diagram of the turbo decoder 32 with a mother code rate of 1/5 as the counterpart of the turbo encoder 10 illustrated in FIG. 4, illustrating code symbols input to the turbo decoder 32. Although an iterative decoding structure is incorporated in the turbo decoder to improve turbo decoding performance, it is not shown in FIG. 6 for notational simplicity.

Referring to FIG. 6, the turbo decoder 32 decodes input code symbols by sequentially operating first and second constituent decoders 32a and 32d (DEC1 and DEC2) in synchronization to clock signals $t_1$ and $t_2$, respectively.

DEC1 receives the code symbols output from ENC1 in eight times, three code symbols at one time at $t_1=0$ through $t_1=7$. DEC2 receives 24 code symbols including those output from ENC2 and zero symbols in eight times, three code symbols at one time at $t_2=0$ through $t_2=7$. Actually, DEC2 receives data decoded in DEC1 and then deinterleaved in a turbo deinterleaver 32b (TBD INTL) at $t_2=0$ through $t_2=5$, and the code symbols $X'_0$ and $X'_1$ output from ENC2 only at $t_2=6$ and $t_2=7$. A turbo deinterleaver 32e (TB DINTL) deinterleaves data decoded in DEC2 and outputs final decoded data $X_0$ to $X_5$.

As described before, the interleaved subblocks may have different types of code symbols for information bits (hereinafter, data symbols) and different types of tail symbols. And the turbo decoder 32 sequentially operates DEC1 and DEC2 using less operation clock pulses than the total clock pulses of the turbo encoder 10. That is, the turbo encoder 10 generates code symbols, running ten times at t=0 through t=9, whereas the turbo decoder 32 decodes data, sequentially operating the constituent decoders eight times at $t_1=0$ through $t_1=7$ or at $t_2=0$ through $t_2=7$.

It is, therefore, concluded that to decode forward packet data traffic, the 1xEV-DV MS should feed code symbols stored in the groups illustrated in FIG. 5 in a buffer to the turbo decoder 32 in the order illustrated in FIG. 6. Hence, the channel deinterleaving illustrated in FIG. 2 is equivalently performed when the code symbols are read from the decoder input buffer and the code symbols are directly applied to the input of the turbo decoder according to the present invention.

Meanwhile, in accordance with the 1xEV-DV standard, all interleaved code symbols are not used for generation of a subpacket because the maximum subpacket size available for transmission is limited. Therefore, the subpacket symbol selector 20 illustrated in FIG. 1 constructs a subpacket using only an available part of the interleaved code symbols. Available code symbols for each EP size are illustrated in FIG. 7.

Figure 7:
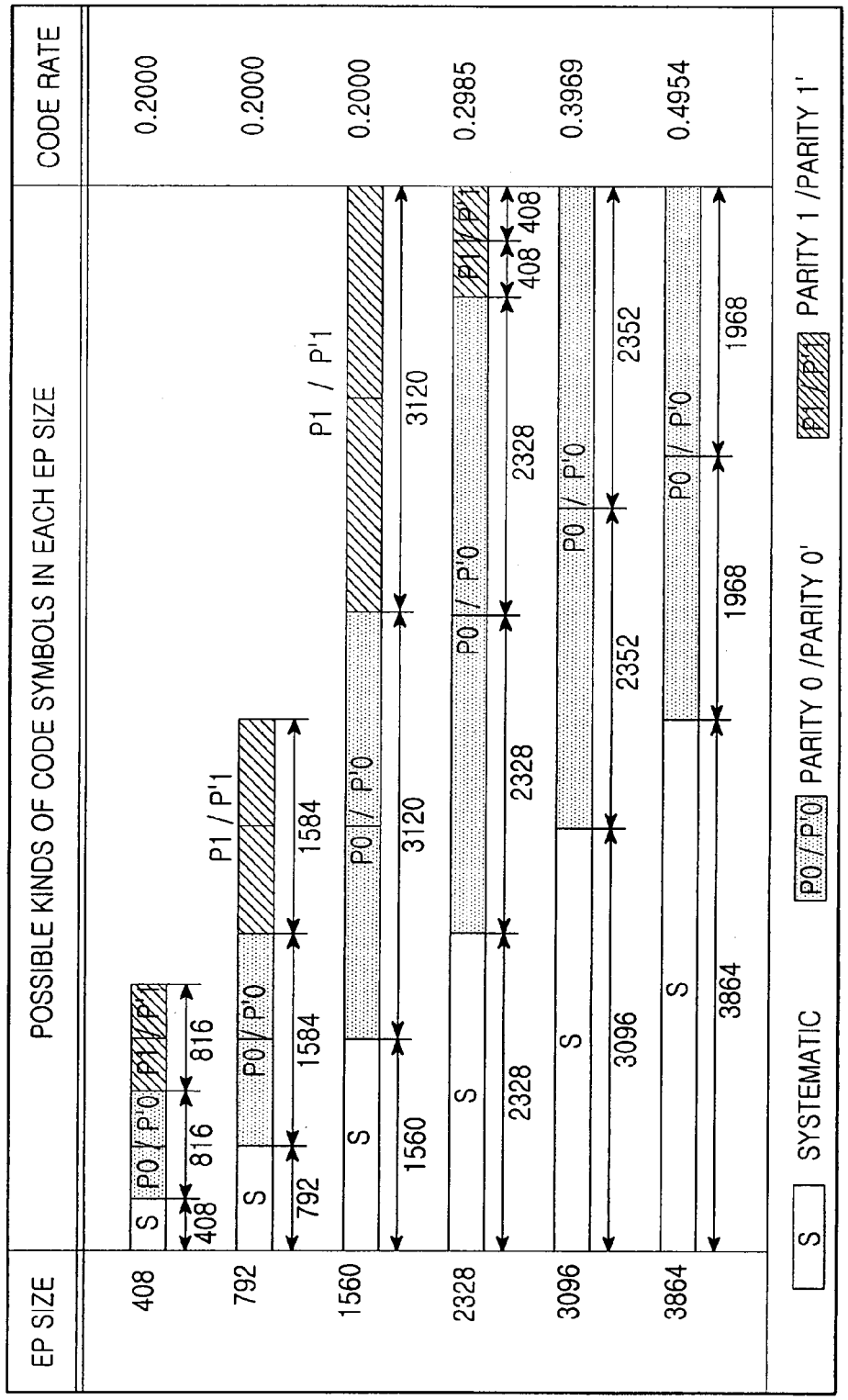
FIG. 7 illustrates available code symbols for each EP size of the F-PDCH according to a 1xEV-DV standard.

Referring to FIG. 7, the number of available code symbols to build a subpacket is limited to five times the size of an EP if the EP is 408, 792 or 1560 bits. If the EP size exceeds 1560 (e.g., 2328, 3096 or 3864), up to 7800 code symbols are available irrespective of the EP size. Thus, a decoder input buffer that an MS requires for receiving forward packet data traffic should have a minimum capacity of 7800 code symbols.

To minimize the time required to feed code symbols to the decoder for high-rate data processing in the MS, it is preferred to provide the three types of code symbols SYS, PA0 and PA1 in parallel to the constituent decoders. To do so, the decoder input buffer is comprised of three memories for storing the different types of code symbols.

Figure 8:
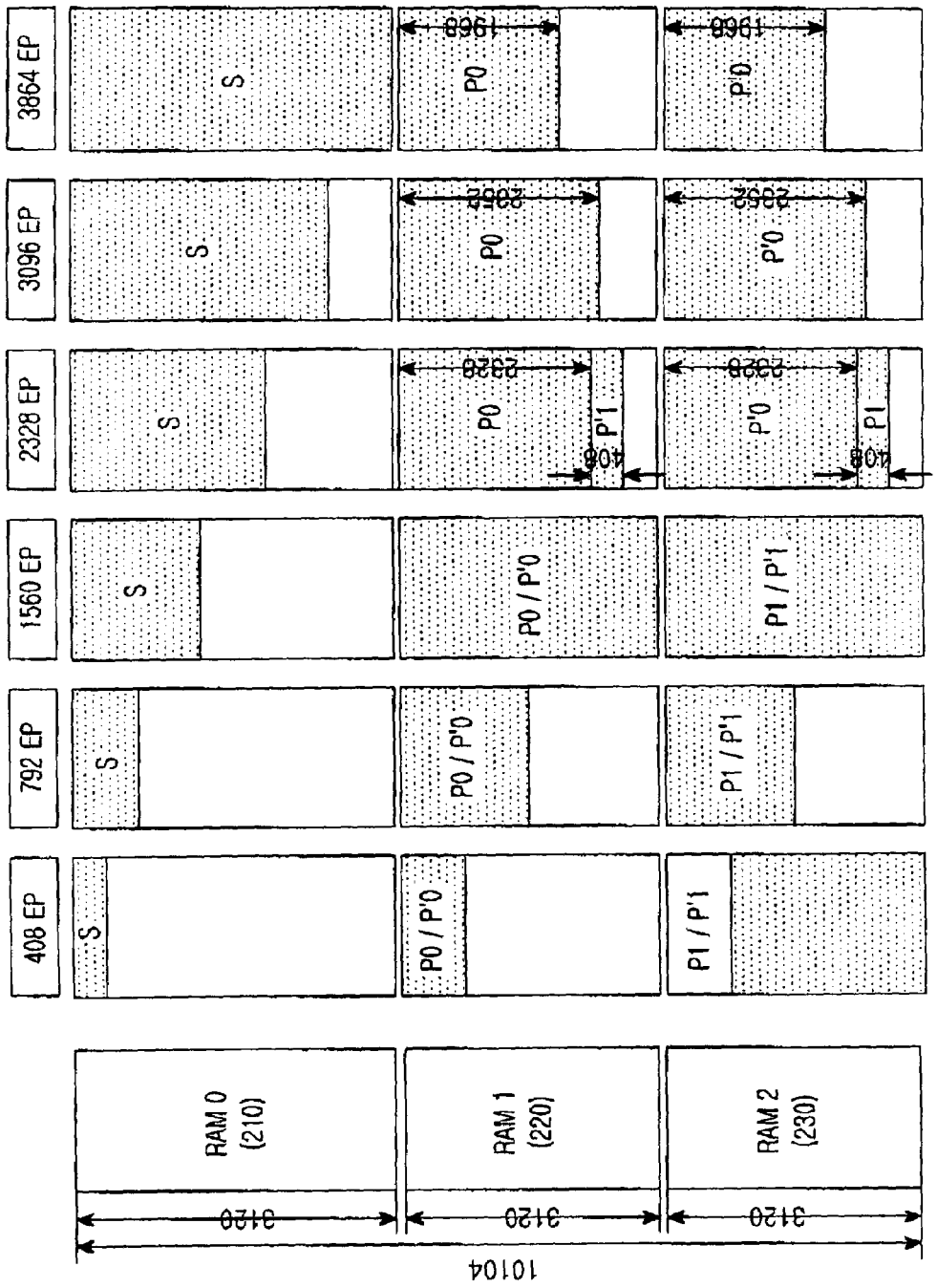
FIG. 8 illustrates the structure of decoder input buffers for buffering forward packet data traffic according to the 1xEV-DV standard.

FIG. 8 illustrates the structure of a decoder input buffer for 1xEV-DV forward packet data traffic. Input code symbols are stored in memories by rows, each row corresponding to one code symbol. A read address indicates the position of a row having an intended code symbol.

Referring to FIG. 8, the decoder input buffer comprises RAMs 210, 220 and 230 (RAM0, RAM1 and RAM2) of 3864, 3120 and 3120 in size, respectively. RAM0 stores the code symbols of the subblock S. RAM1 stores the code symbols of the P0/P'0 group, or the code symbols of the subblock P0, or a part of the P0 subblock code symbols and a part of the P'1 subblock code symbols (i.e. 408 code symbols). RAM2 stores the code symbols of the P1/P'1 group, or the code symbols of the subblock P'0, or a part of the P'0 subblock code symbols and a part of the P1 subblock code symbols (i.e. 408 code symbols). The reason for the complexity of the decoder input buffer is that the number and types of available code symbols are limited according to an EP size and the decoder input buffer design aims to minimize a decoder input time.

A method and apparatus for sequentially reading the code symbols from the above-constituted decoder input buffer illustrated in FIG. 8 will be described below.

Figure 9:
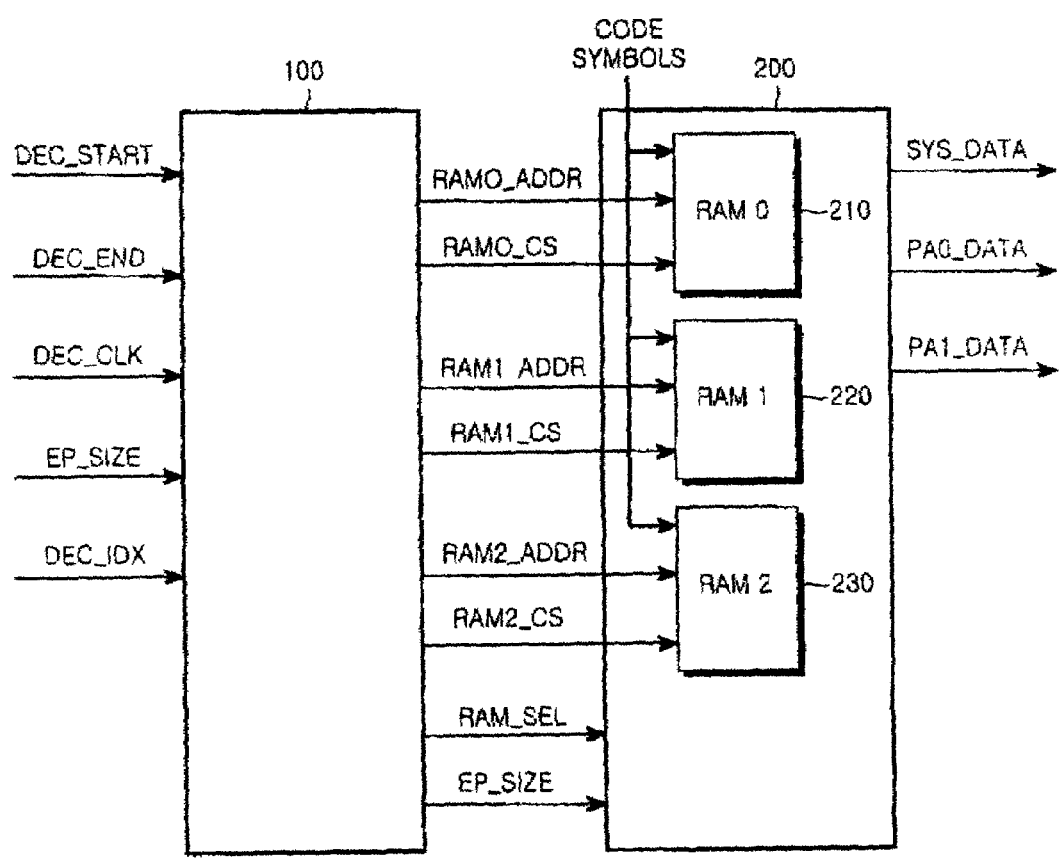
FIG. 9 is a block diagram of an input control apparatus for a turbo decoder according to an embodiment of the present invention.

FIG. 9 is a schematic block diagram of an input control apparatus for the turbo decoder according to an embodiment of the present invention. Referring to FIG. 9, the input control apparatus includes a read address generator (RAG) 100, and a memory unit 200 with the RAMs 210, 220 and 230. The RAG 100 outputs three read addresses for the RAMs 210, 220 and 230 in response to signals received from the turbo decoder. The memory unit 200 outputs three code symbols at the read addresses to the turbo decoder.

Concerning signals input to the RAG 100, DEC_START indicates the start of turbo decoding, DEC_END indicates completed decoding of one subpacket, and DEC_CLK is a clock signal corresponding to the operation frequency of the turbo decoder. EP_SIZE is a 3-bit index representing an EP size for decoding. It represents the EP sizes of 408, 792, 1560, 2328, 3096 and 3864 as '000', '001', '010', '011', '100' and '101', respectively. DEC_IDX identifies a constituent decoder in current operation in the turbo decoder. If the first constituent decoder is running, DEC_IDX is set to 0, and if the second constituent decoder is running, DEC_IDX is set to 1.

Figure 10:
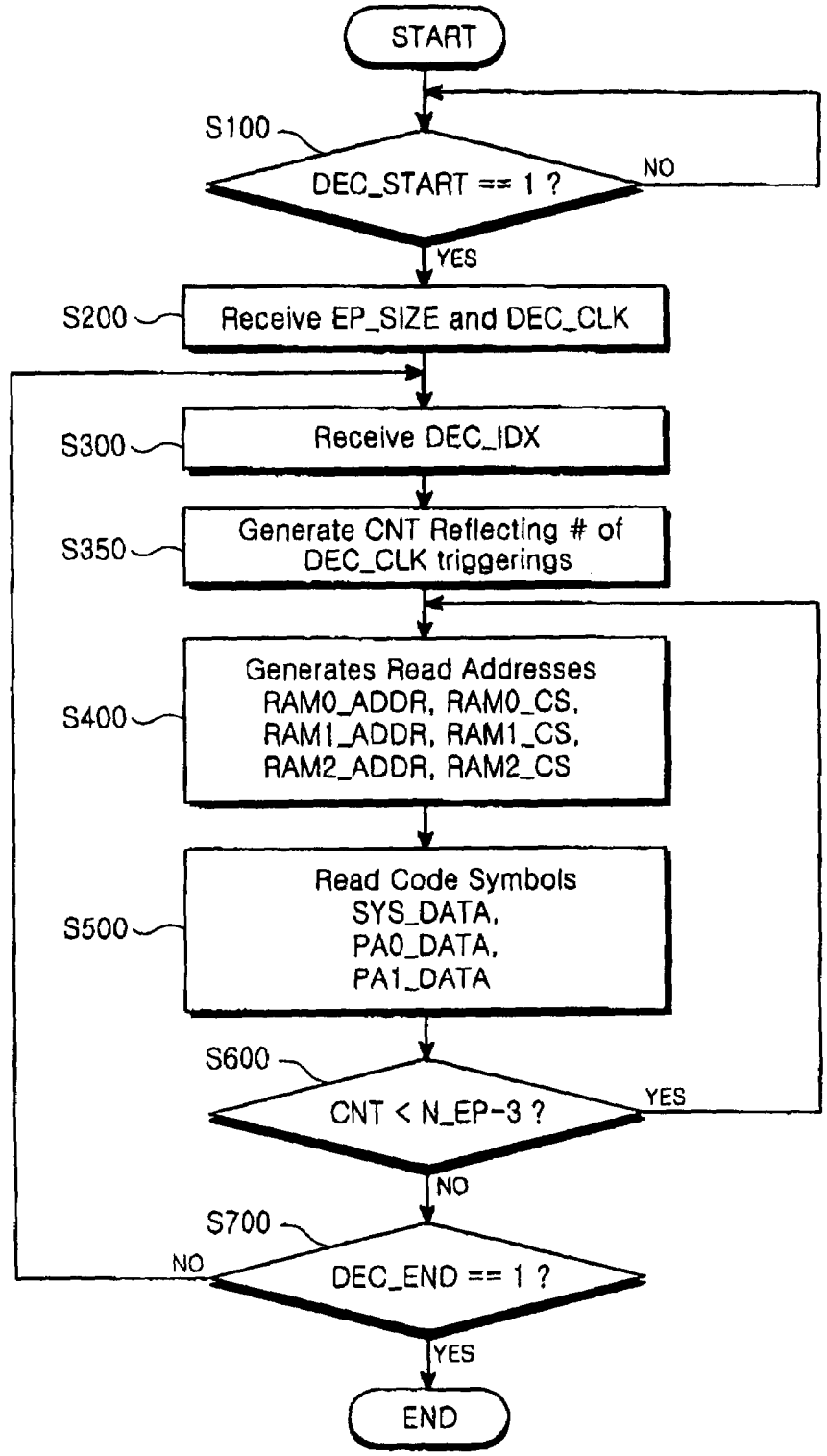
FIG. 10 is a flowchart illustrating the operation of the input control apparatus illustrated in FIG. 9.

FIG. 10 is a flowchart illustrating the operation of the input control apparatus illustrated in FIG. 9.

Before this operation starts, the demodulated code symbols of a subpacket have been stored in the RAMs 210, 220 and 230 in an interleaved order. Code symbol types accommodated in the respective RAMs 210, 220 and 230 are illustrated in FIG. 8 and the code symbols are arranged in the RAMs in the order illustrated in FIG. 5.

Referring to FIG. 10, if DEC_START=1 in step S100, the RAG 100 receives EP_SIZE and DEC_CLK among signals needed for the operation of the RAG 100 in step S200. In step S300, the RAG 100 receives the other signal required for its operation, DEC_IDX. The RAG 100 sets a count value (CNT) which increases by 1 each time in synchronization to DEC_CLK in step S350 and generates CS signals, RAM0_CS, RAM1_CS and RAM2_CS and read addresses RAM0_ADDR, RAM1_ADDR and RAM2_ADDR for the respective RAMs 210, 220 and 230, in consideration of subblock deinterleaving and subblock symbol ungrouping in step S400. In step S500, the memory unit 200 reads code symbols from the RAMs 210, 220 and 230 or inserts zero symbols according to the CS signals and read addresses, and thus outputs turbo decoder input data SYS_DATA, PA0_DATA and PA1_DATA.

If CNT is less than the number of data symbols other than three tail symbols in each subblock, that is, N_EP-3 in step S600, the RAG 100 and the memory unit 200 are operated again in steps S400 and S500. On the contrary, if CNT is equal to or greater than N_EP-3, it is determined whether DEC_END is 1 in step S700. If DEC_END is 1, which implies that the code symbols of the subpacket are all fed to the turbo decoder 32, the procedure ends. If DEC_END is not 1, the RAG 100 receives DEC_IDX again in step S300. After CNT is generated in the RAG 100, steps S400, S500 and S600 are performed again.

Figure 11:
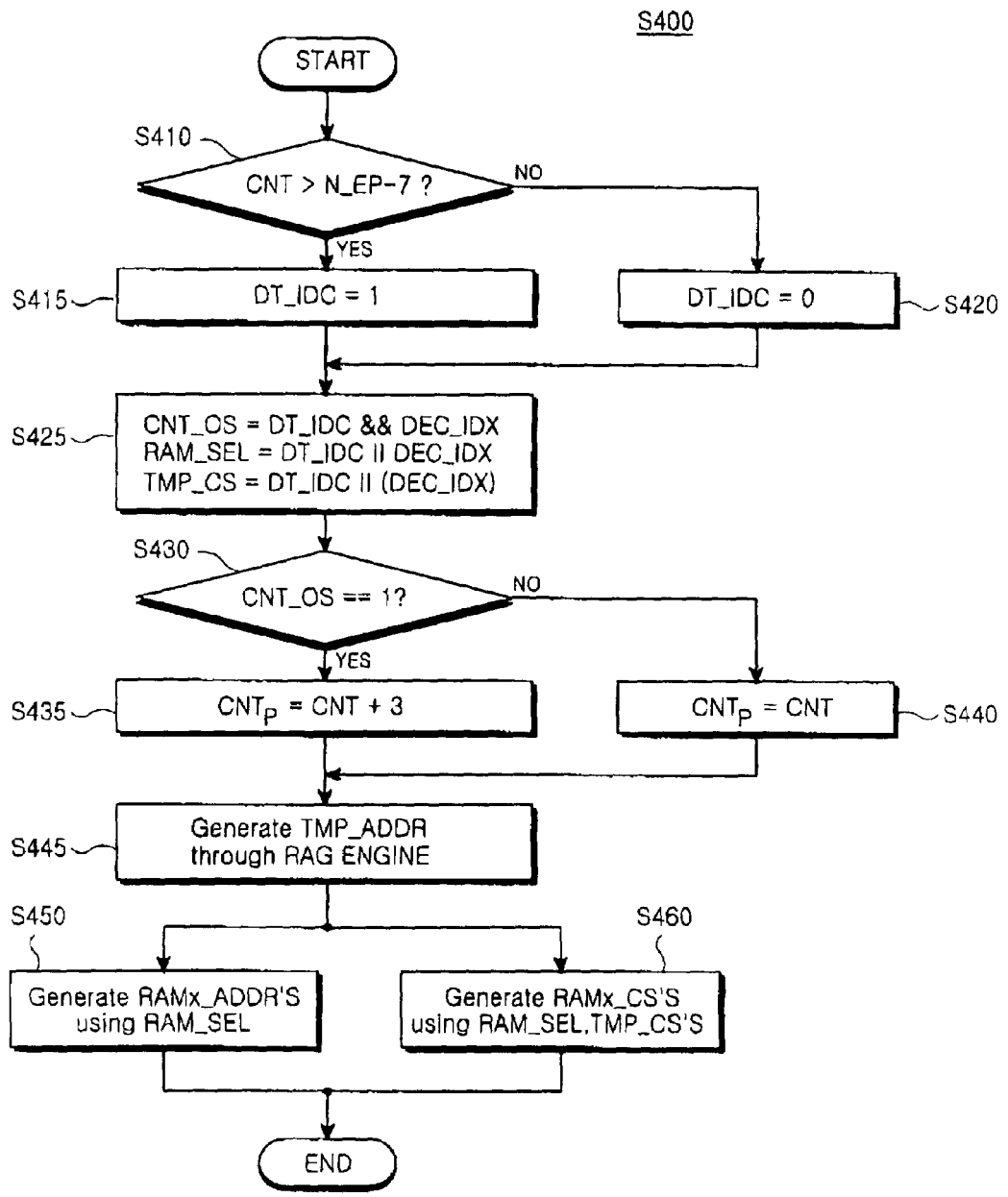
FIG. 11 is a flowchart illustrating the operation of a read address generator (RAG) in the input control apparatus according to an embodiment of the present invention.

FIG. 11 is a flowchart illustrating the operation of the RAG 100 in step S400 illustrated in FIG. 10. This procedure is carried out each time DEC_CLK is triggered after triggering of DEC_START, that is, each time CNT is increased by 1. CNT is an index identifying a data symbol to be input to a constituent decoder. Here, information bits are distinguished from tail bits. Considering the EP size, N_EP and the number (i.e., 3) of tail symbols to be fed to each constituent decoder, CNT increases within a range from 0 to N_EP-4 (=N-EP-1-3) each time DEC_CLK is triggered.

Referring to FIG. 11, CNT is compared with N_EP-7 to decide whether a code symbol to be read in response to a current clock pulse is a data symbol (DT_IDC=0) or a tail symbol (DT_IDC=1) in step S410. Since one subblock includes 3×2 tail bits, N_EP-7 (=EP size-1-3×2) information bits are involved in one subblock of size N_EP-1. Thus, if CNT is greater than N_EP-7, DT_IDC is 1, indicating a tail symbol in step S415. Otherwise, DT_IDC is 0 indicating a data symbol in step S420.

In step S425, CNT_OS, RAM_SEL and TMP_CS are generated according to DT_IDC and DEC_IDX. CNT_OS identifies a tail symbol for the second constituent decoder (CNT_OS=DT_IDC&&DEC_IDX, && represents AND operation). RAM_SEL is 0 only when data symbols (DT_IDC=0) are read for the first constituent decoder (DEC_IDX=0). That is, RAM_SEL=DT_IDC ||DEC_IDX, || representing OR operation. TMP_CS is 0 only when data symbols (DT_IDC=0) are read for the second constituent decoder (DEC_IDX=1). That is, TMP_CS=DT_IDC || (DEC_IDX), representing inversion.

In step S430, it is decided whether CNT_OS is 1 to determine whether the current code symbol is a tail symbol for the second constituent decoder. Referring to FIGS. 4 and 6, tail symbols output from ENC2 at t=8 and t=9 are fed to DEC2 at $t_2=6$ and $t_2=7$. Hence, if a tail symbol is read for the second constituent decoder (CNT_OS=1), CNT must be increased by the number of tail symbols. If CNT_OS=1, a new count value $CNT_p$ is set by increasing CNT by 3 in step S435. Otherwise, CNT is maintained as $CNT_p$ in step S440.

A temporary read address TMP_ADDR is generated according to $CNT_p$ in a subblock deinterleaving rule in step S445. TMP_ADDR indicates the position of an intended code symbol in each subblock in consideration of subblock deinterleaving only. Therefore, the read addresses RAM0_ADDR, RAM1_ADDR and RAM2_ADDR are generated for the three RAMs using TMP_ADDR and RAM_SEL in step S450.

To describe step S450 in detail, only in the case where a data symbol (DT_IDC=0) is input to the first constituent decoder (DEC_IDX=0), thus RAM_SEL=0, does a PA0 symbol or PA1 symbol exist in the subblock P0 or P1. In the other cases, the PA0 or PA1 symbol exists in the subblock P'0 or P'1. For example, the PA0/PA1 data symbols for the first constituent decoder are in the subblock P0 or P1, while the PA0/PA1 tail symbols from ENC1, the PA0/PA1 data symbols from ENC2, and the PA0/PA1 tail symbols from ENC2 exist in the subblocks P'0 and P'1. Subblock symbol grouping is an alternate arrangement of the P0 code symbols and the P'0 code symbols, or the P1 code symbols and the P'1 code symbols. Thus, addresses at which the P'0 and P'1 code symbols are stored are calculated by doubling those at which the P0 and P1 code symbols are stored. Step S450 will be described in more detail with reference to FIG. 13.

Since the types of transmittable code symbols are limited as illustrated in FIG. 7, intended code symbols may not be stored at read addresses obtained in step S450. Therefore, CS signals RAMx_CS are generated for the three RAMs using TMP_ADDR, RAM_SEL and TMP_CS. If an intended code symbol is not stored in a corresponding RAM, the CS signal for the RAM is 0 and, instead, the turbo decoder receives a zero zero. Step S460 will be described later with reference to FIG. 15.

Figure 12:
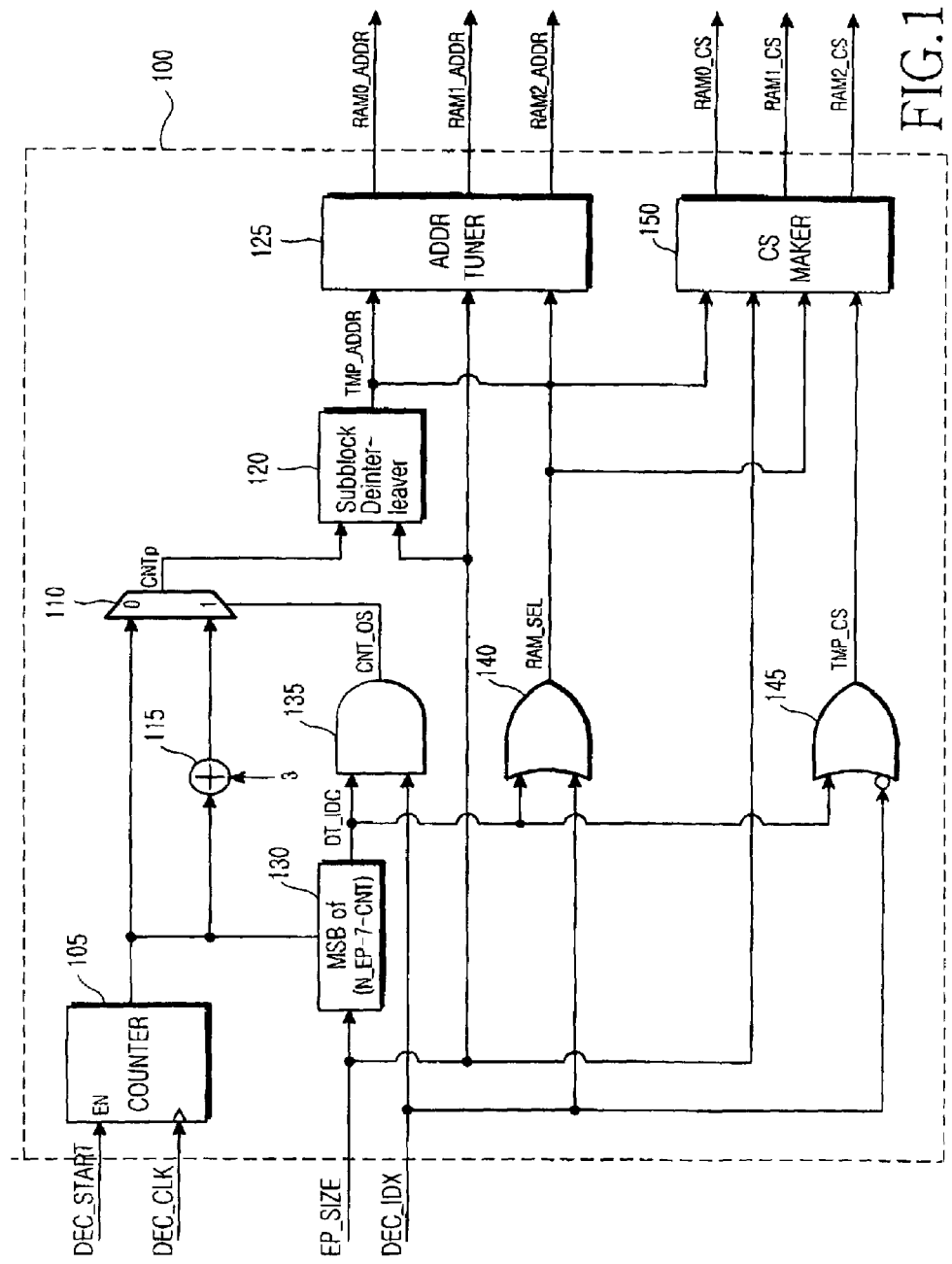
FIG. 12 is a detailed block diagram of the RAG in the input control apparatus according to an embodiment of the present invention.

FIG. 12 is a block diagram of the RAG 100 operated in accordance with the procedure illustrated in FIG. 11.

Referring to FIG. 12, a counter 105 increases CNT by 1 each time DEC_CLK is triggered, starting from the time when DEC_START=1. A Most Significant Bit (MSB) extractor 130 extracts the MSB of (N_EP-7)-CNT according to CNT and N_EP corresponding to EP_SIZE and outputs it as DT_IDC. An AND gate 135 generates CNT_OS by AND-operating DT_IDC and DEC_IDX. An OR gate 140 generates RAM_SEL by OR-operating DT_IDC and DEC-IDX, and an OR gate 145 generates TMP_CS by OR-operating DT_IDC and the inverse of DEC_IDX.

A selector 110 outputs CNT as $CNT_p$ if CNT_OS=0 and CNT+3 as $CNT_p$ if CNT_OS=1. A subblock deinterleaver 120 generates a temporary read address TMP_ADDR indicating the position of a code symbol to be read in a subblock using $CNT_p$ and EP_SIZE. The operation of the subblock deinterleaver 120 is beyond the scope of the present invention and thus its description is not provided here.

An ADDR tuner 125 then generates read addresses RAM0_ADDR, RAM1_ADDR and RAM2_ADDR for the three RAMs based on TMP_ADDR, EP_SIZE and RAM_SEL, and a CS maker 150 generates CS signals RAM0_CS, RAM1_CS and RAM2_CS for the three RAMs using TMP_ADDR, EP_SIZE, RAM_SEL and TMP_CS. The structures of the ADDR tuner 125 and the CS maker 150 are shown in detail in FIGS. 14 and 18, respectively and their operations will be described later.

Figure 13:
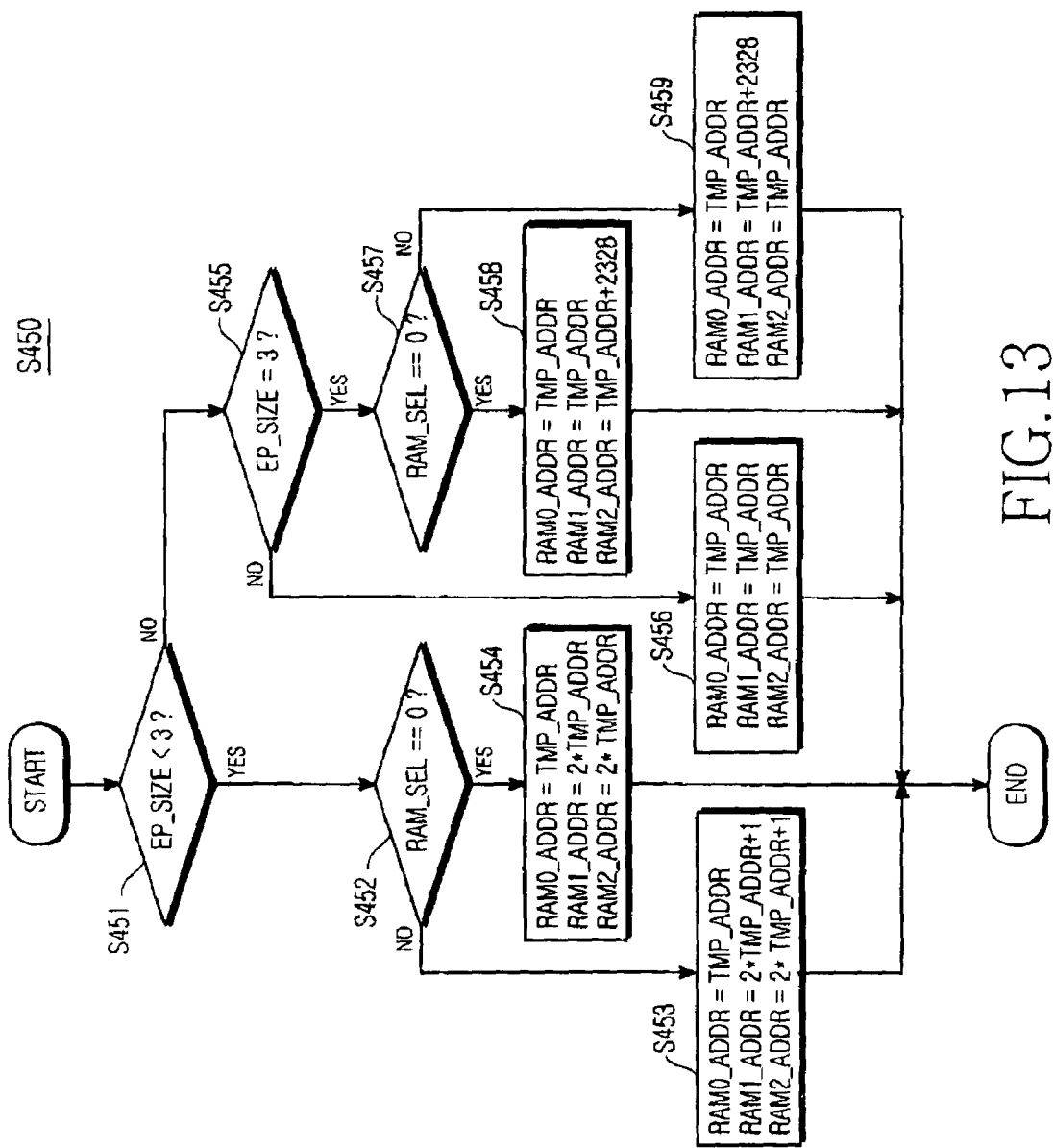
FIG. 13 is a flowchart illustrating the operation of an address tuner (ADDR tuner) in the RAG according to an embodiment of the present invention.

FIG. 13 is a flowchart illustrating the operation of the ADDR tuner 125 in step S450 of FIG. 11. As illustrated in FIG. 8, since the code symbols of the subblock S are always stored in RAM0, TMP_ADDR is used as RAM0_ADDR for RAM0 in every case.

When EP_SIZE is less than 3, that is, N_EP is one of 408, 792 and 1560 in step S451, the P0/P'0 group and P1/P'1 group are stored in RAM1 and RAM2, respectively as illustrated in FIG. 8. In step S452, the ADDR tuner 125 decides whether the first constituent decoder needs a data symbol (RAM_SEL=0).

As described before, only when RAM_SEL=0, do PA0 symbols and PA1 symbols exist in the subblocks P0 and P1, respectively, and in the other cases, the PA0 and PA1 symbols exist in the subblocks P'0 and P'1, respectively. The code symbols of the subblocks P0 and P1 are at even-numbered positions of the P0/P'0 and P1/P'1 groups, respectively, whereas the code symbols of the subblocks P'0 and P'1 are at odd-numbered positions of the P0/P'0 and P1/P'1 groups, respectively. If RAM_SEL=0, therefore, the ADDR tuner 125 sets TMP_ADDR, 2×TMP_ADDR and 2×TMP_ADDR as RAM0_ADDR, RAM1_ADDR and RAM2_ADDR, respectively in step S454. If RAM_SEL=1, the ADDR tuner 125 sets TMP_ADDR, 2×TMP_ADDR+1 and 2×TMP_ADDR+1 as RAM0_ADDR, RAM1_ADDR and RAM2_ADDR, respectively in step S453.

In summary, when N_EP is 408, 792 or 1560, RAM1_ADDR and RAM2_ADDR are determined according to RAM_SEL as illustrated in Table 1 below.

TABLE 1

| RAM_SEL | RAM1_ADDR | RAM2_ADDR |
|---|---|---|
| 0 | 2xTMP_ADDR | 2xTMP_ADDR |
| 1 | 2xTMP_ADDR+1 | 2xTMP_ADDR+1 |

If EP_SIZE is equal to or greater than 3 in step S451, the ADDR tuner 125 decides whether EP_SIZE is 3, that is, N_EP is 2328 in step S455. If N_EP is 2328, the entire code symbols of the subblock S and 408 code symbols of the subblock P'1 are in RAM1, and the entire code symbols of the subblock P'0 and 408 code symbols of the subblock P1 are in RAM2. Unlike the case where N_EP is 408, 792 or 1560, the P0/P'0 and P1/P'1 code symbols are already separated by subblock symbol ungrouping in RAM1 and RAM2. This is because the sizes of RAM1 and RAM2 are limited to 3120.

If EP_SIZE=3, that is, N_EP=2328, the ADDR tuner 125 decides whether the first constituent decoder needs a data symbol (RAM_SEL=0) in step S457. Only if RAM_SEL=0, the PA0 and PA1 symbols are in the subblocks P0 and P1, and if RAM_SEL=1, the PA0 and PA1 symbols are in the subblocks P'0 and P'1. The P'1 code symbols are positioned in a trailing part of RAM1, that is, at addresses 2328 through 2735 (i.e., 2328+408-1) in RAM1, and the P1 code symbols are positioned in a trailing part of RAM2, that is, at addresses 2328 through 2735 (i.e., 2328+408-1) in RAM2. Therefore, if RAM_SEL=0, the ADDR tuner 125 sets TMP_ADDR, TMP_ADDR and TMP_ADDR+2328 for RAM0_ADDR, RAM1_ADDR and RAM2_ADDR, respectively in step S458. If RAM_SEL=1, the ADDR tuner 125 sets TMP_ADDR, TMP_ADDR+2328 and TMP_ADDR for RAM0_ADDR, RAM1_ADDR and RAM2_ADDR, respectively in step S459.

In summary, when N_EP is 2328, RAM1_ADDR and RAM2_ADDR are determined according to RAM_SEL as illustrated in Table 2 below.

TABLE 2

| RAM_SEL | RAM1_ADDR | RAM2_ADDR |
|---|---|---|
| 0 | TMP_ADDR | TMP_ADDR+2328 |
| 1 | TMP_ADDR+2328 | TMP_ADDR |

Finally, if EP_SIZE is greater than 3, that is, N_EP is 3096 or 3864 in step S455, none of the P1 and P'1 code symbols are in any of the RAMs. Only the code symbols of the subblock P0 are stored in RAM1, and only the code symbols of the subblock P'0 are stored in RAM2. Therefore, the ADDR tuner 125 sets all RAM0_ADDR, RAM1_ADDR and RAM2_ADDR to TMP_ADDR.

In summary, when N_EP is 3096 or 3864, RAM1_ADDR and RAM2_ADDR are determined irrespective of RAM_SEL as illustrated in Table 3 below.

TABLE 3

| RAM_SEL | RAM1_ADDR | RAM2_ADDR |
|---|---|---|
| 0 | TMP_ADDR | TMP_ADDR |
| 1 | TMP_ADDR | TMP_ADDR |

Figure 14A:
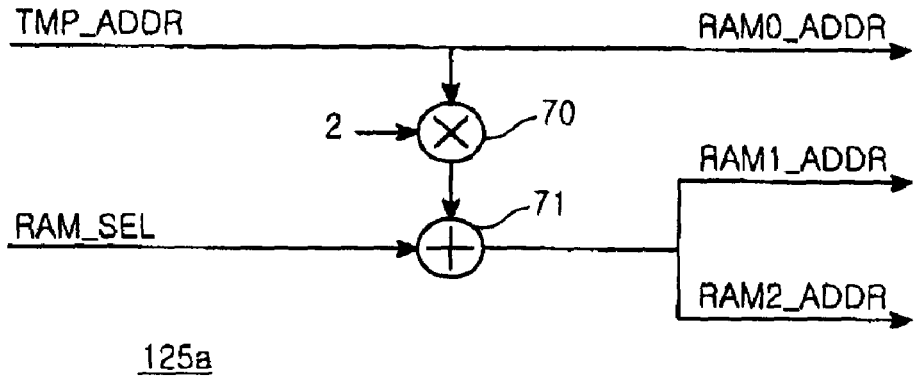
FIGS. 14A, 14B and 14C are block diagrams of the ADDR tuner according to an embodiment of the present invention.
Figure 14B:
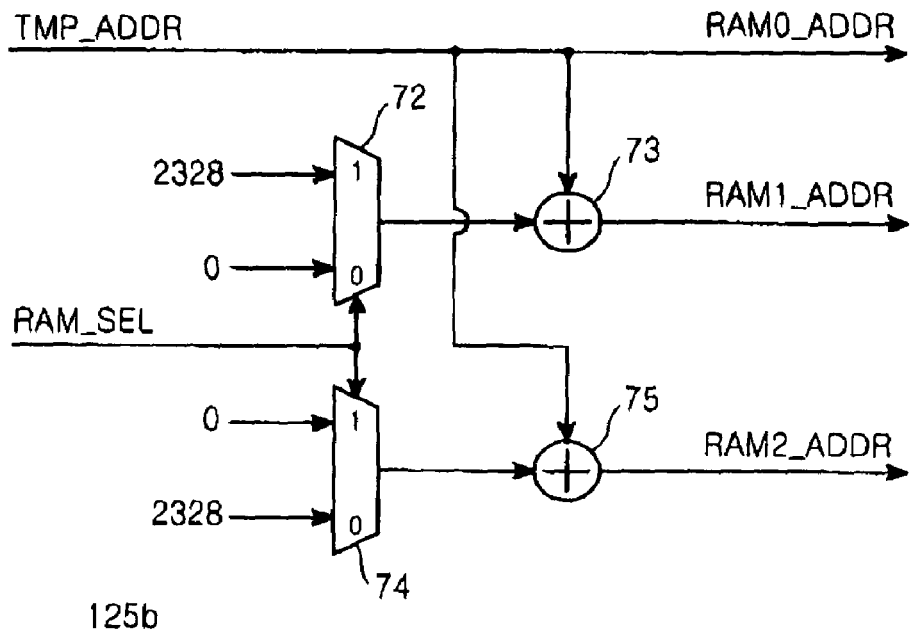
Figure 14C:
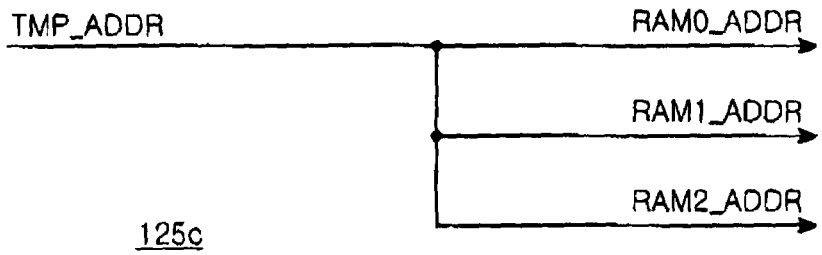

FIGS. 14A, 14B and 14C illustrate in detail the structure of the ADDR tuner 125 operated in the procedure illustrated in FIG. 13. As illustrated, the ADDR tuner 125 includes a part 125a for N_EP being one of 408, 792, and 1560, a part 125b for N_EP being 2328, and a part 125C for N_EP being one of 3096 and 3964.

Referring to FIG. 14A, in the part 125a for N_EP of 408, 792 or 1560, TMP_ADDR is simply output as RAM0_ADDR. A multiplier 70 multiplies TMP_ADDR by 2 and an adder 71 adds the product to RAM_SEL and outputs the sum as RAM1_ADDR and RAM2_ADDR. Referring to FIG. 14B, in the part 125b for N_EP of 2328, TMP_ADDR is simply output as RAM0_ADDR. A selector 72 outputs 2328 when RAM_SEL=1 and a selector 74 outputs 2328 when RAM_SEL=0. An adder 73 then adds TMP_ADDR to the output of the selector 72 (2328 or 0) and outputs the sum as RAM1_ADDR. An adder 75 adds TMP_ADDR to the output of the selector 74 (0 or 2328) and outputs the sum as RAM2_ADDR. Referring to FIG. 14C, in the part 125c for N_EP of 3096 or 3864, TMP_ADDR is simply output as RAM0_ADDR, RAM1_ADDR and RAM2_ADDR.

Figure 15:
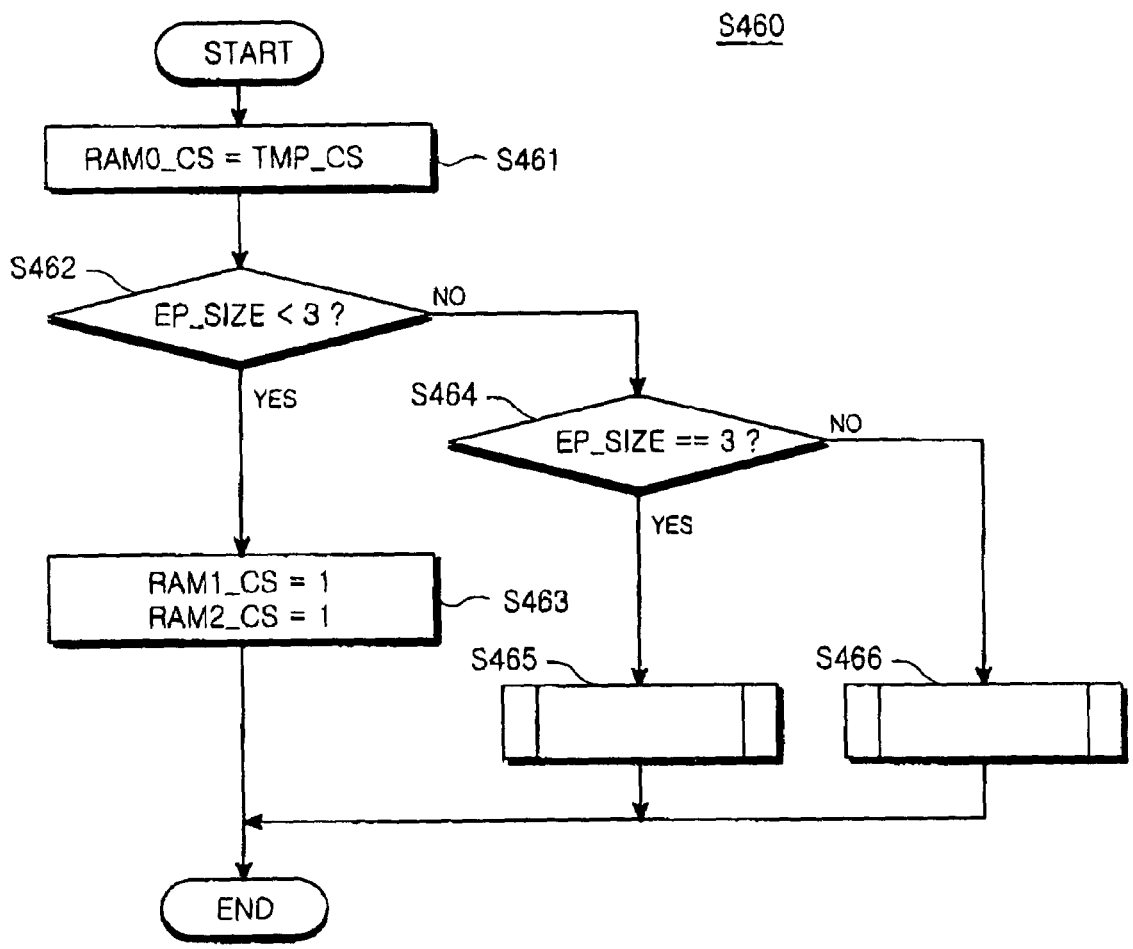
FIG. 15 is a flowchart illustrating the operation of a CS (Chip Select) maker in the RAG according to an embodiment of the present invention.

FIG. 15 is a flowchart illustrating the operation of the CS maker 150 in step S460 of FIG. 11. The CS maker 150 generates the CS signals RAM0_CS, RAM1_CS and RAM2_CS for the three RAMs. It sets CS signals for RAMs having no code symbols to be read to 0s. If a CS signal is 0, a clock signal for accessing a corresponding RAM is not provided and thus a code symbol cannot be read from the RAM. Thus, a code symbol at a corresponding position is replaced by 0.

Referring to FIG. 8, if a data symbol (DT_IDC=0) is read for the second constituent decoder (DEC_IDX=1), there is no need for reading the code symbols of the subblock S from RAM0 irrespective of EP_SIZE. As illustrated in FIG. 6, since turbo-interleaved data output from the first constituent decoder is used as the input of the second constituent decoder, RAM0 does not need to be accessed. This can be decided according to TMP_CS illustrated in FIG. 11. As listed in Table 4 below, TMP_CS is 0 irrespective of EP_SIZE if DT-ICT=0 and DEC_IDX=1, and it is always 1 in the other cases.

TABLE 4

| DT_IDC (A) | DEC_IDX (B) | TMP_CS OR(A, ~B) |
|---|---|---|
| 0 | 0 | 1 |
|  | 1 | 0 |
| 1 | 0 | 1 |
|  | 1 | 1 |

Hence, TMP_CS is used as RAM0_CS in step S461.

The CS maker 150 decides whether EP_SIZE is less than 3 to determine RAM1_CS and RAM2_CS in step S462. If EP_SIZE is less than 3, that is, N_EP is one of 408, 792 and 1560, RAM1_CS and RAM2_CS are always 1 in step S463 because RAM1 and RAM2 store all the code symbols of the P0/P'0 and P1/P'1 groups, respectively. The CS maker 150 decides whether EP_SIZE is 3 in step S464. If EP_SIZE is 3, the CS maker 150 proceeds to step S465 and, if EP_SIZE is not 3, it goes to step S466. Steps S465 and S466 are depicted in detail in FIGS. 16 and 17.

Figure 16:
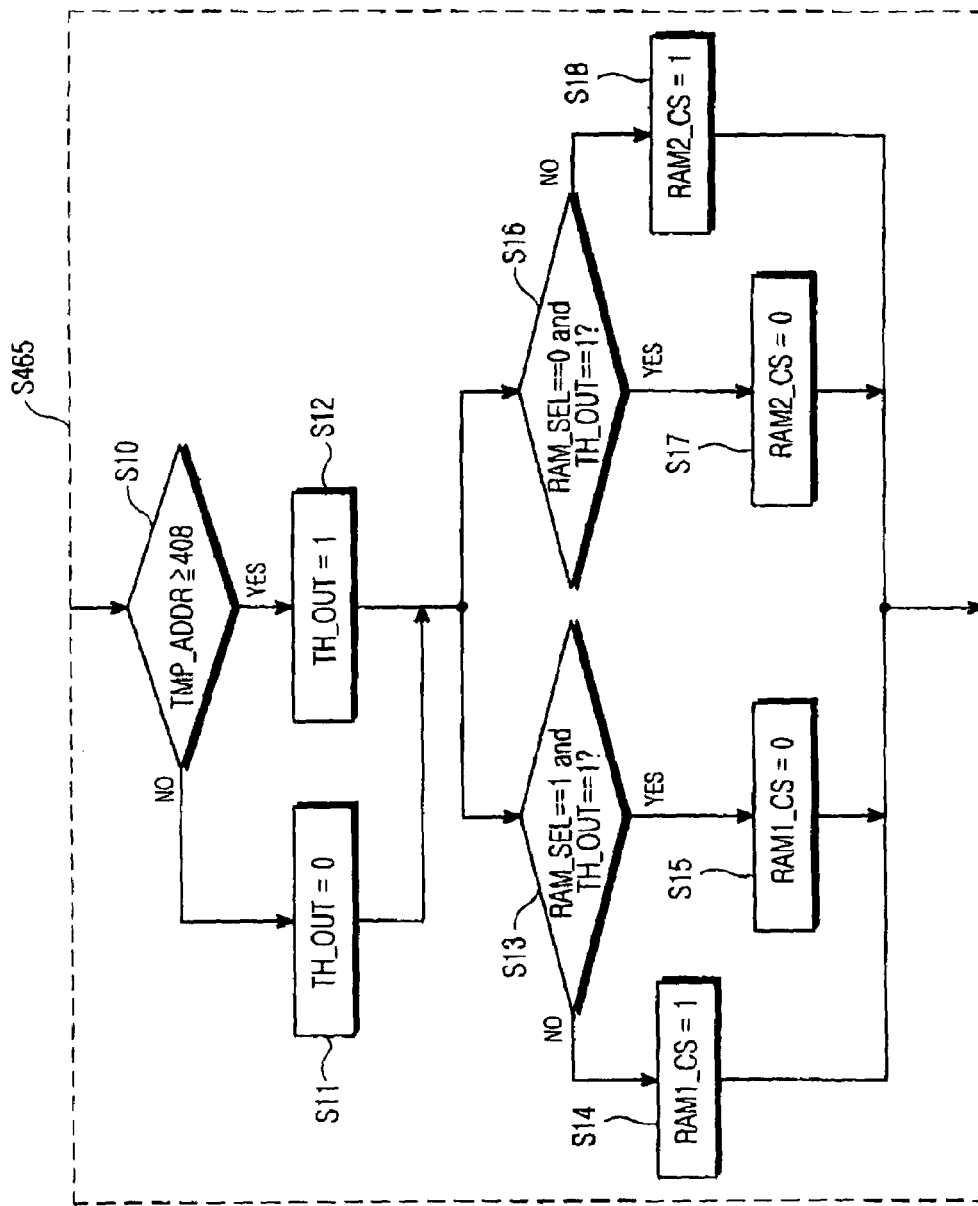
FIG. 16 is a flowchart illustrating an operation in the CS maker for deciding RAM1_CS and RAM2_CS when N_EP=2328 according to an embodiment of the present invention.

FIG. 16 is a flowchart illustrating an operation for the CS maker 150 to determine RAM1_CS and RAM2_CS in step S465 when N_EP is 2328 (EP_SIZE=3).

Referring to FIGS. 8 and 16, if TMP_ADDR is equal to or greater than 408 in step S10, there are neither P'1 code symbols in RAM1 nor P1 code symbols in RAM2. Therefore, a variable TH_OUT is set to 1 in step S12. If TMP_ADDR is less than 408, TH_OUT is set to 0 in step S11. Here, TH_OUT is a criterion by which it is determined whether TMP_ADDR exceeds a predetermined threshold (i.e. 408).

When RAM_SEL=1, P'1 code symbols should be read, and when RAM_SEL=0, P1 code symbols should be read. Therefore, if RAM_SEL=1 and TH_OUT=1 in step S13, RAM1_CS is set to 0 in step S15. If RAM_SEL=0 or TH_OUT=0, RAM1_CS is set to 1 in step S14. If RAM_SEL=0 and TH_OUT=1 in step S16, RAM2_CS is set to 0 in step S17, and if RAM_SEL=1 or TH_OUT=0, RAM2_CS is set to 1 in step S18.

In summary, when N_EP is 2328, RAM1_CS and RAM2_CS are determined according to RAM_SEL and TH_OUT as illustrated in Table 5 below.

TABLE 5

| RAM$_{SEL}$ (A) | TH$_{OUT}$ (B) | RAM1_CS NAND(A, B) | RAM2_CS NAND(-A, B) |
|---|---|---|---|
| 0 | 0 | 1 | 1 |
| 0 | 1 | 1 | 0 |
| 1 | 0 | 1 | 1 |
| 1 | 1 | 0 | 1 |

Figure 17:
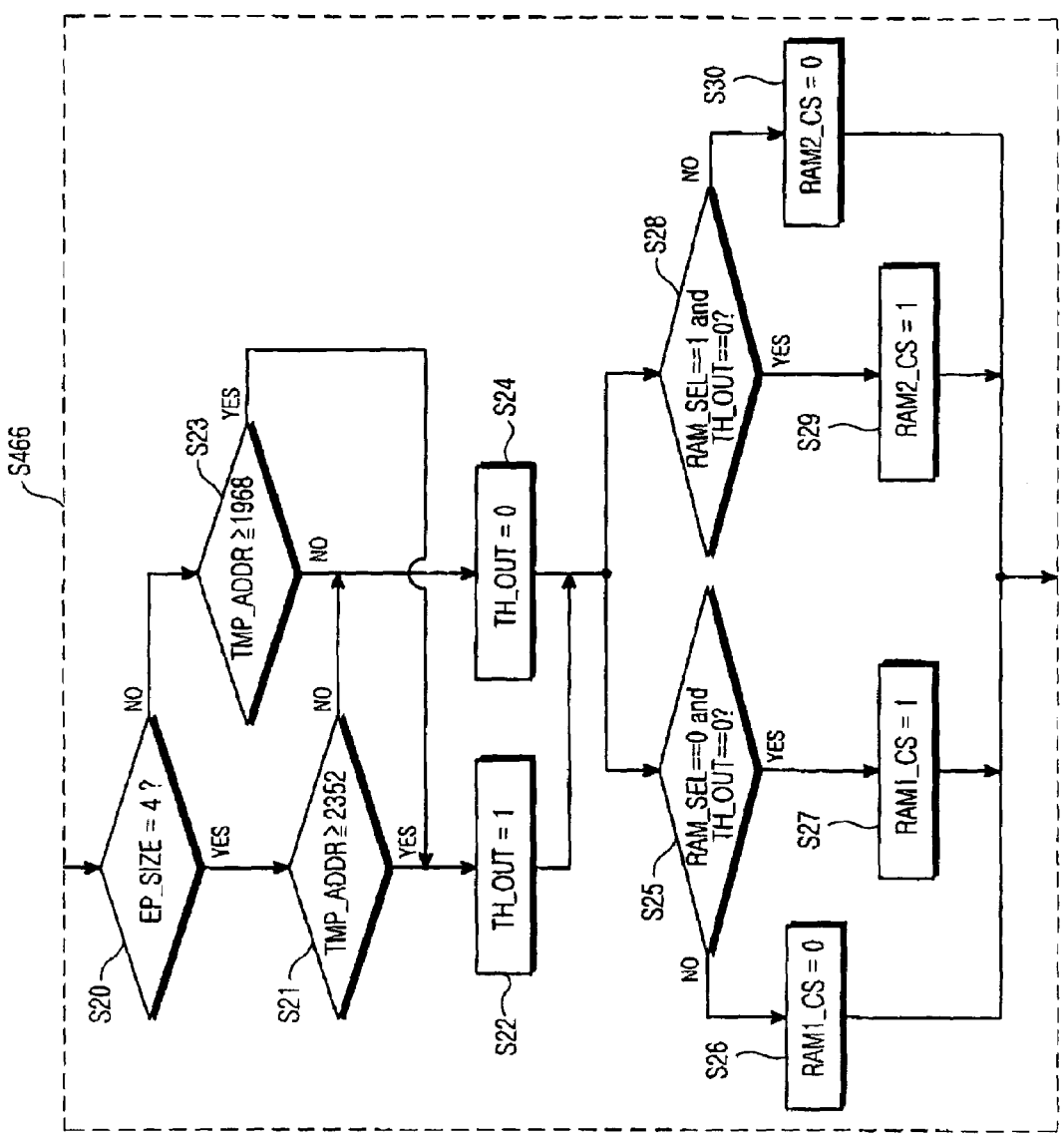
FIG. 17 is a flowchart illustrating an operation in the CS maker for deciding RAM1_CS and RAM2_CS when N_EP>2328 according to an embodiment of the present invention.

FIG. 17 is a flowchart illustrating an operation for the CS maker 150 to determine RAM1_CS and RAM_CS in step S466 of FIG. 15 when N_EP is 3096 or 3864 (EP_SIZE>3).

Referring to FIG. 17, the CS maker 150 decides whether N_EP is 4 (EP_SIZE=3096) in step S20. If EP_SIZE=3096, the CS maker 150 decides whether TMP_ADDR is equal to or greater than 2352 in step S21. Referring to FIG. 8, if TMP_ADDR is equal to or greater than 2352, there are neither P0 code symbols nor P'0 code symbols in RAM1 and RAM2. Therefore, if TMP_ADDR is equal to or 2352, TH_OUT is set to 1 in step S22. If TMP_ADDR is less than 2352, TH_OUT is set to 0 in step S24.

The CS maker 150 decides whether TMP_ADDR is equal to or 1968 in step S23, as in the case of N_EP=3864. If it is, RAM1 and RAM2 do not have P0 and P'0 code symbols. Hence, if TMP_ADDR is equal to or greater than 1968, TH_OUT is set to 1 in step S22. If TMP_ADDR is less than 1968, TH_OUT is set to 0 in step S24. TH_OUT is a criterion by which the CS maker 150 decides whether TMP_ADDR exceeds a predetermined threshold (2352 or 1968).

When RAM_SEL=0, P0 code symbols should be read, and when RAM_SEL=1, P'0 code symbols should be read. Therefore, if RAM_SEL=0 and TH_OUT=0 in step S25, RAM1_CS is set to 1 in step S27. If RAM_SEL=1 or TH_OUT=1, RAM1_CS is set to 0 in step S26. If RAM_SEL=1 and TH_OUT=0 in step S28, RAM2_CS is set to 1 in step S29, and if RAM_SEL=0 or TH_OUT=1, RAM2_CS is set to 0 in step S30.

In summary, when N_EP is 3096 or 3864, RAM1_CS and RAM2_CS are determined according to RAM_SEL and TH_OUT as illustrated in Table 6 below.

TABLE 6

| RAM$_{SEL}$ (A) | TH$_{OUT}$ (B) | RAM1_CS NOR(A, B) | RAM2_CS NOR(-A, B) |
|---|---|---|---|
| 0 | 0 | 1 | 0 |
| 0 | 1 | 0 | 0 |
| 1 | 0 | 0 | 1 |
| 1 | 1 | 0 | 0 |

Figure 18A:
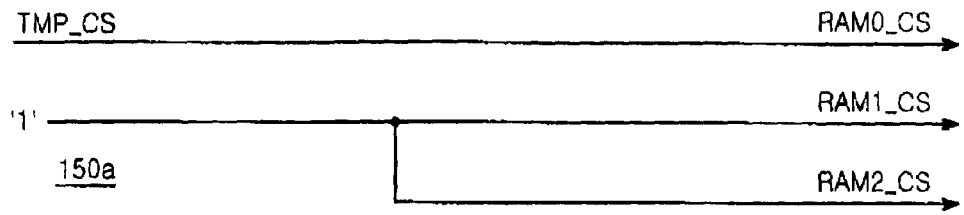
FIGS. 18A, 18B, 18C and 18D are block diagrams of the CS maker in the RAG according to the embodiment of the present invention.
Figure 18B:
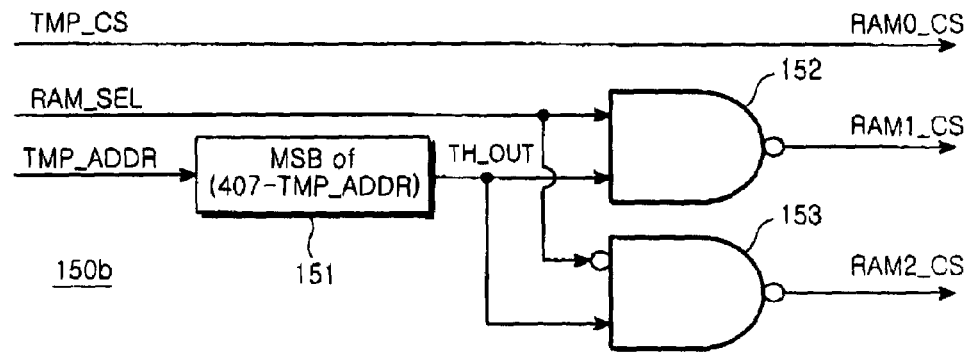
Figure 18C:
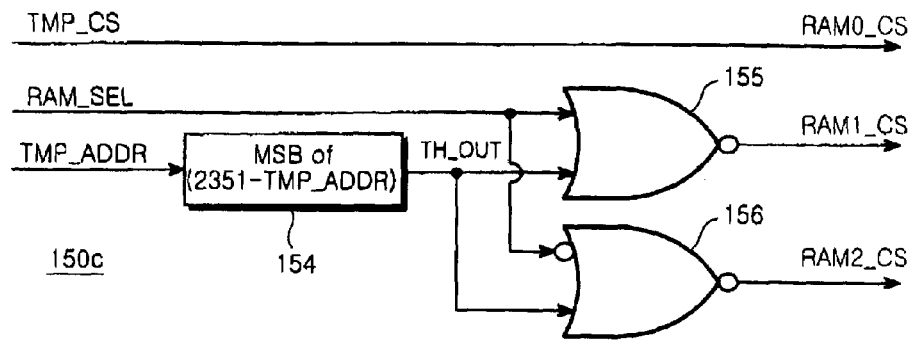

FIGS. 18A, 18B and 18C illustrate the structure of the CS maker 150 operated in the procedures illustrated in FIGS. 15, 16 and 17. As illustrated, the CS maker 150 includes a part 150a for N_EP being one of 408, 792, and 1560, a part 150b for N_EP being 2328, a part 150C for N_EP being one 3096, and a part 150d for N_EP being 3864.

Referring to FIG. 18A, in the part 150a for N_EP of 408, 792 or 1560, TMP_CS is simply output as RAM0_CS and RAM1_CS and RAM2_CS are always 1. Referring to FIG. 18B, in the part 150b for N_EP of 2328, TMP_CS is simply output as RAM0_CS. An MSB extractor 151 receives TMP_ADDR and extracts the MSB, TH_OUT from 407-TMP_ADDR. A NAND gate 152 generates RAM1_CS by NAND-operating RAM_SEL and TH_OUT. A NAND gate 153 generates RAM2_CS by NAND-operating the inverse of RAM_SEL and TH_OUT.

Figure 18D:
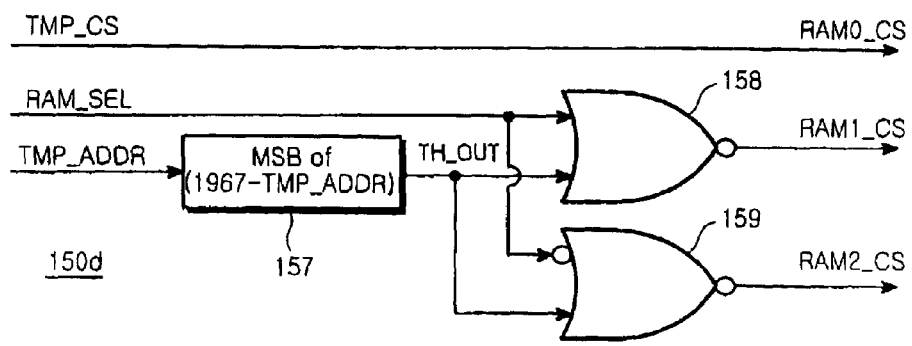

Referring to FIG. 18C, in the part 150c for N_EP of 3096, TMP_CS is simply output as RAM0_CS. An MSB extractor 154 receives TMP_ADDR and extracts the MSB, TH_OUT from 2351-TMP_ADDR. A NOR gate 155 generates RAM1CS by NOR-operating RAM_SEL and TH_OUT. A NOR gate 156 generates RAM2_CS by NOR-operating the inverse of RAM_SEL and TH_OUT. Referring to FIG. 18D, in the part 150d for N_EP of 3864, TMP_CS is simply output as RAM0_CS. An MSB extractor 157 receives TMP_ADDR and extracts the MSB, TH_OUT from 1967-TMP_ADDR. A NOR gate 158 generates RAM1_CS by NOR-operating RAM_SEL and TH_OUT. A NOR gate 159 generates RAM2_CS by NOR-operating the inverse of RAM_SEL and TH_OUT.

Figure 19:
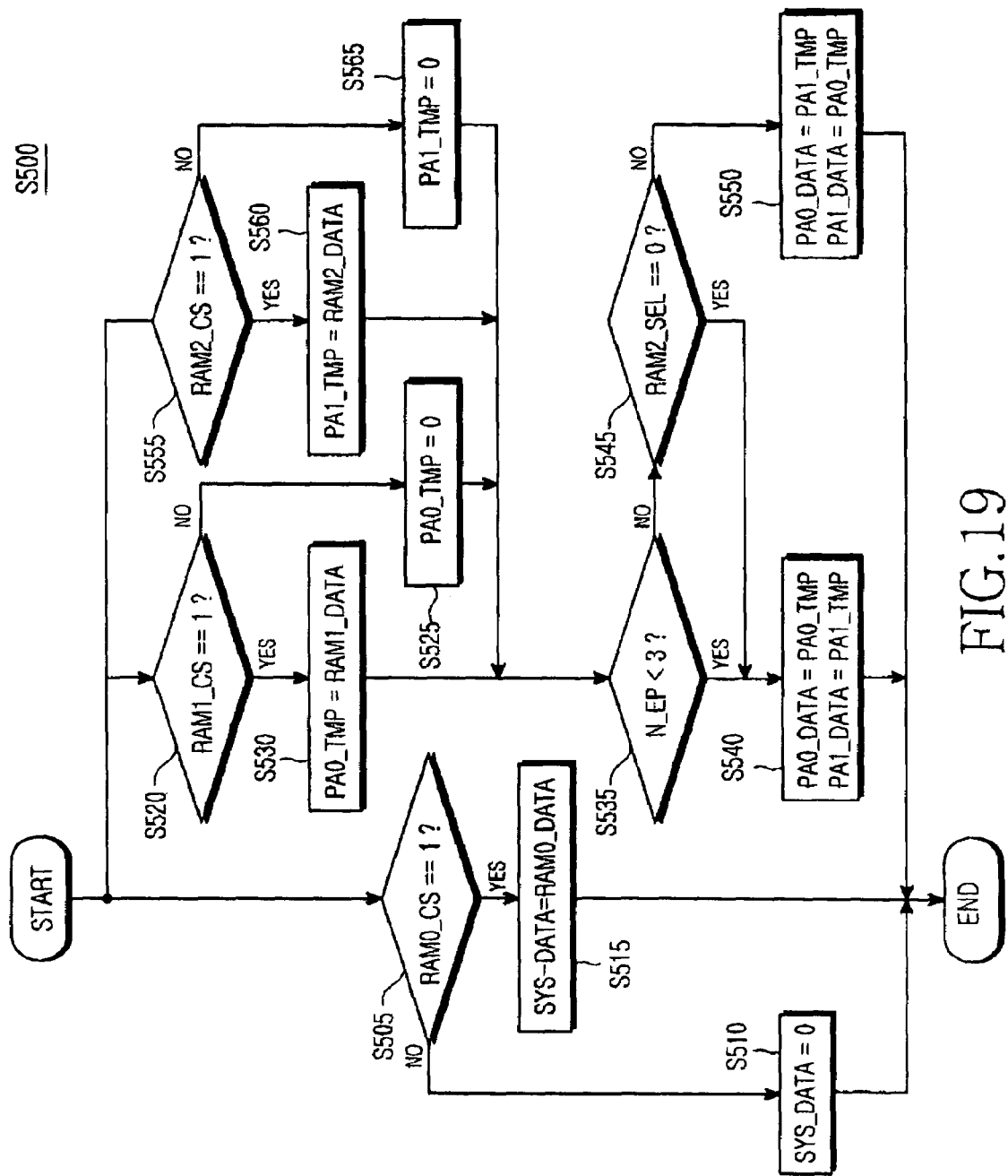
FIG. 19 is a flowchart illustrating the operation of a memory unit in the input control apparatus according to an embodiment of the present invention.

FIG. 19 is a flowchart illustrating the operation of the memory unit 200 in step S500 of FIG. 10. The memory unit 200 reads three code symbols from the RAMs 210, 220 and 230 in response to RAM0_ADDR, RAM1_ADDR, RAM2_ADDR, RAM0_CS, RAM1_CS, and RAM2_CS, switches two of the three code symbols when necessary, or outputs zero symbols in the absence of code symbols to be read.

Referring to FIG. 19, if RAM0_CS is 1 in step S505, the memory unit 200 outputs RAM0_DATA corresponding to RAM0_ADDR as SYS_DATA in step S515. If RAM0_CS is 0, the memory unit 200 outputs a zero symbol as SYS_DATA in step S510. If RAM1_CS is 1 in step S520, the memory unit 200 outputs RAM1_DATA corresponding to RAM1_ADDR as PA0_TMP in step S530. If RAM1_CS is 0, the memory unit 200 outputs a zero symbol as PA0_TMP in step S525. If RAM2_CS is 1 in step S555, the memory unit 200 outputs RAM2_DATA corresponding to RAM2_ADDR as PA1_TMP in step S560. If RAM2_CS is 0, the memory unit 200 outputs a zero symbol as PA1_TMP in step S565.

Referring to FIG. 8, when EP_SIZE is less than 3, that is, N_EP is one of 408, 792 and 1560, the code symbols read from RAM1 belong to the subblock P0 or P'0 all of the time, and the code symbols read from RAM2 belong to the subblock P1 or P'1 all of the time. On the other hand, if EP_SIZE is 3, that is, N_EP is 2328, the code symbols of the subblock P'1 are stored at addresses following 2328 in RAM1, and the code symbols of the subblock P'0 are stored at addresses following 2328 in RAM2. If EP_SIZE is greater than 3, that is, N_EP is 3096 or 3864, the code symbols of the subblock P'0 are stored in RAM2. Therefore, to input the P0 and P1 code symbols to the first constituent decoder and the P'0 and P'1 code symbols to the second constituent decoder, the code symbols read from RAM1 should be exchanged with those read from RAM2 according to EP_SIZE.

If EP_SIZE is less than 3 in step S535, PA0_TMP and PA1_TMP are used as PA0_DATA and PA1_DATA, respectively, without exchange in step S540. If EP_SIZE is equal to or greater than 3, the memory unit 200 decides whether RAM_SEL is 0 in step S545. It can be decided whether to exchange PA0_TMP with PA1_TMP depending on whether a P0 or P1 code symbols is needed (RAM_SEL=0) or a P'0 or P'1 code symbols is needed (RAM_SEL=1). If RAM_SEL is 1, the memory unit 200 PA1_DATA and PA0_DATA are produced by exchanging PA0_TMP with PA1_TMP in step S550. If RAM_SEL is 0, PA0_TMP and PA1_TMP become PA0_DATA and PA1_DATA without exchange in step S540.

Figure 20:
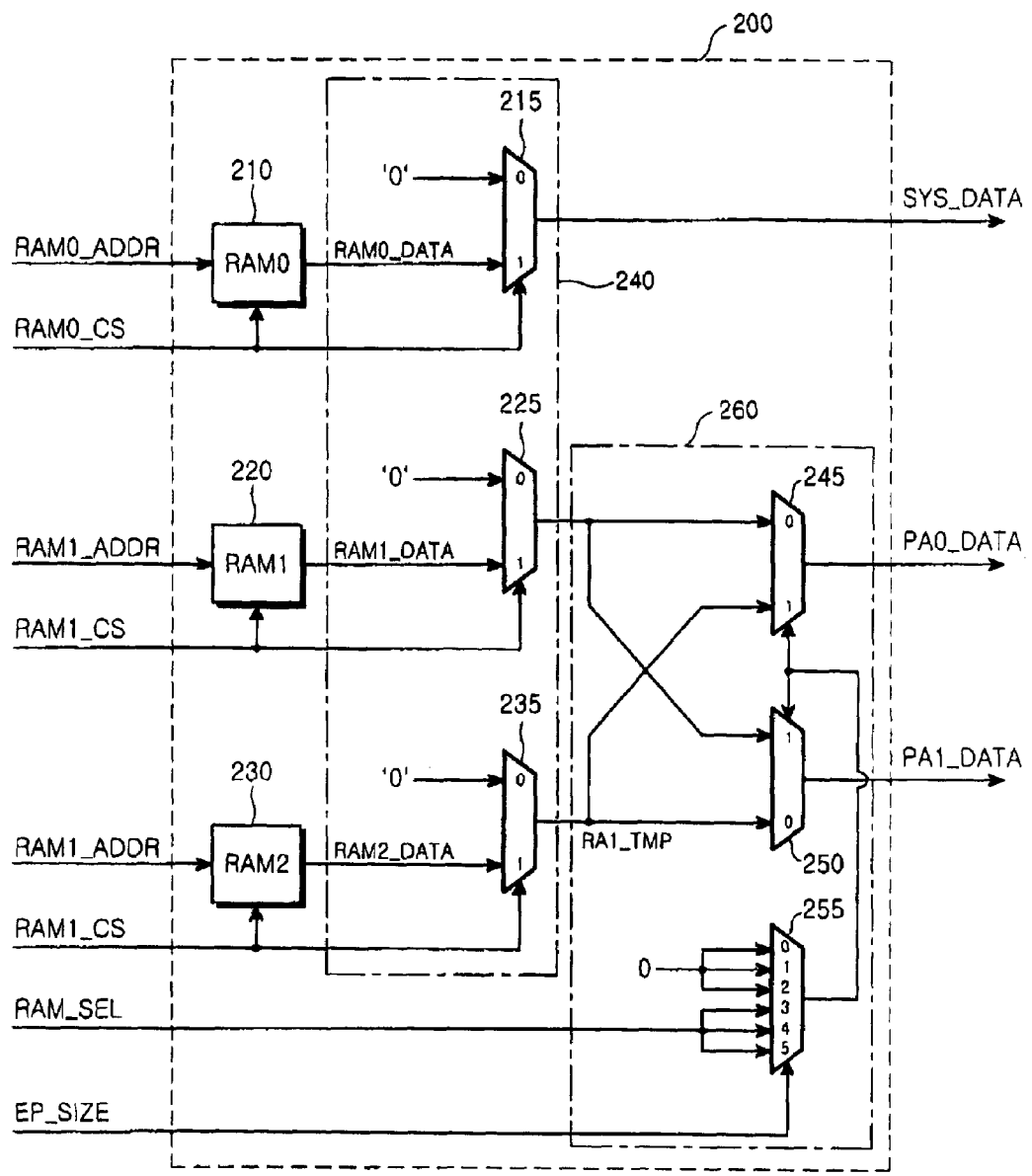
FIG. 20 is a block diagram of the memory unit in the input control apparatus according to an embodiment of the present invention.

FIG. 20 is a detailed block diagram of the memory unit 200 operated in the procedure of FIG. 19. Referring to FIG. 20, the memory unit 200 includes the three RAMs 210, 220 and 230, a zero inserter 240, and a RAM switch 260. The memory unit 200 outputs SYS_DATA, PA0_DATA and PA1_DATA at the same time in response to the read addresses RAM0_ADDR, RAM1_ADDR and RAM2_ADDR, the CS signals RAM0_CS, RAM1_CS and RAM2_CS, RAM_SEL, and EP_SIZE.

The RAMs 210, 220 and 230 output RAM0_DATA, RAM1_DATA and RAM2_DATA in response to RAM0_ADDR, RAM _ADRR and RAM2_ADDR. The zero inserter 240 has three selectors 215, 225 and 235 to decide SYS_DATA, PA0_DATA and PA1_DATA according to RAM0_CS, RAM1_CS and RAM2_CS. The selector 215 selects RAM0_DATA from RAM0 as SYS_DATA only when RAM0_CS is 1, and selects a zero symbol as SYS_DATA when RAM0_CS is 0. The selector 225 selects RAM1_DATA from RAM1 as PA0_TMP only when RAM1_CS is 1, and selects a zero symbol as PA0_TMP when RAM1_CS is 0. The selector 235 selects RAM2_DATA from RAM2 as PA1_TMP only when RAM2_CS is 1, and selects a zero symbol as PA1_TMP when RAM2_CS is 0.

The RAM switch 260 has three selectors 245, 250 and 255 to appropriately match PA0_TMP and PA1_TMP to PA0_DATA and PA1_DATA. If EP_SIZE is less than 3, that is, N_EP is one of 408, 792 and 1560, the selector 255 selects 0 and outputs it as a select signal for the selectors 245 and 250. The selectors 245 and 250 then simply output PA0_TMP and PA1_TMP as PA0_DATA and PA1_DATA. However, if EP_SIZE is equal to or greater than 3, that is, N_EP is 2328, 3096 or 3864, the selector 255 selects RAM_SEL and outputs it as a select signal for the selectors 245 and 250. The selectors 245 and 250 output PA0_TMP and PA1_TMP as PA0_DATA and PA1_DATA only if RAM_SEL is 0, and exchange PA0_TMP with PA1_TMP and output PA0_TMP as PA1_DATA and PA1_TMP as PA0_DATA if RAM_SEL is 1.

Figure 21:
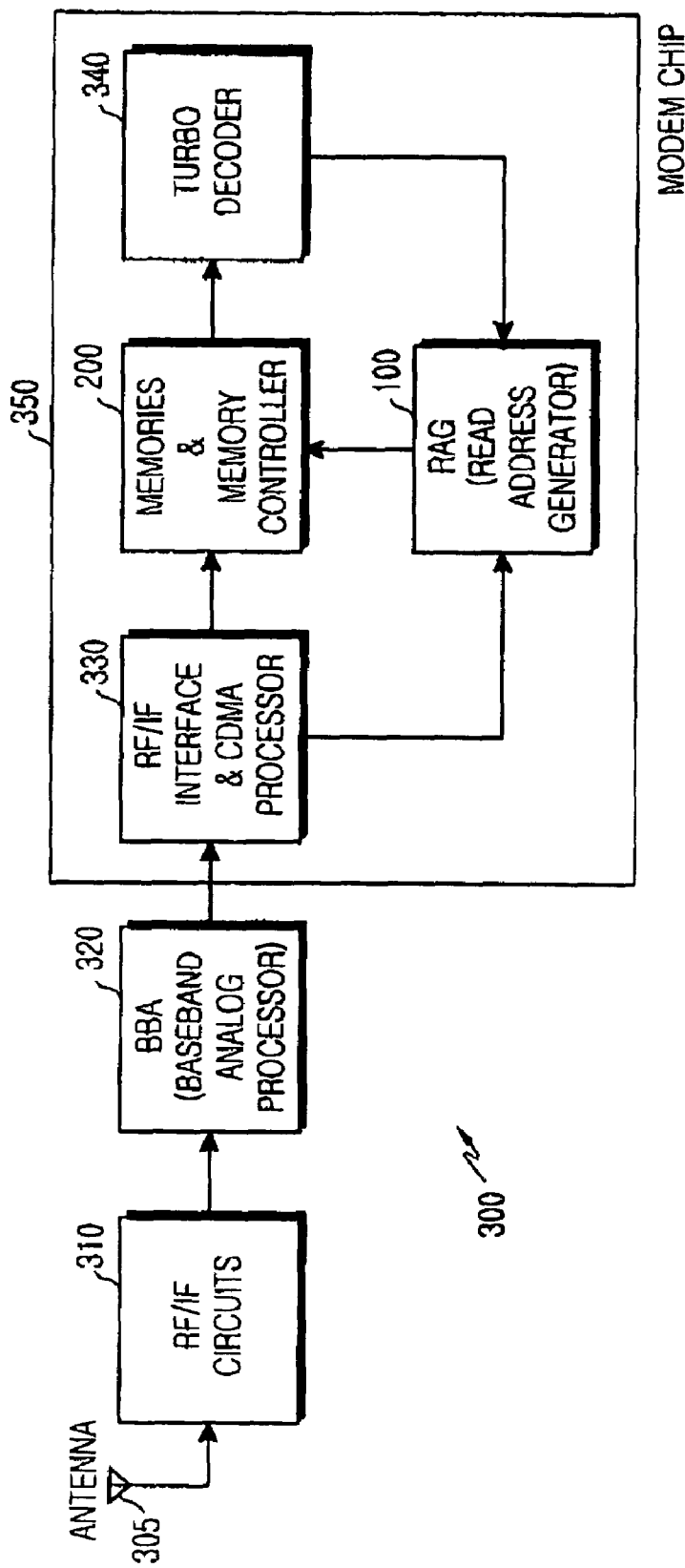
FIG. 21 is a block diagram of an MS receiver which has the input control apparatus including the memory unit and the RAG according to an embodiment of present invention.

FIG. 21 is a block diagram of an MS receiver which has the input control apparatus comprising the memory unit and the RAG according to an embodiment of the present invention.

Referring to FIG. 21, an RF signal is received from a transmitter at an antenna 305 in an MS receiver 300. A baseband converter 310 downconverts the frequency of the RF signal to a baseband analog signal. A BBA (Baseband Analog Processor) 320 converts the baseband analog signal to a digital signal.

A modem 350 demodulates the digital signal as traffic data and control data through an RF/IF interface and CDMA processor 330 consisting of demodulators. The traffic data is stored as decoder input data in a predetermined area of one of the three RAMs in the memory unit 200, while the control data is applied to the input of the RAG 100 of the modem 350, for use as basic data to generate read addresses. The control data contains EP_SIZE, particularly.

A turbo decoder 340 receives DEC_START from the RAG 100 to initiate decoding. The turbo decoder 340 continuously provides DEC_CLK and DEC_IDX to the RAG 100. When the RAG 100, having received DEC_START and other signals, is activated and generates read addresses at which code symbols to be input to the turbo decoder 240 are stored, the memory unit 200 reads the code symbols from the read addresses and feeds them to the turbo decoder 340.

The above operation of the RAG 100 continues until it receives DEC_END from the turbo decoder 340.

As described above, the present invention offers the benefits of small size, low cost and low power consumption for a 1xEV-DV terminal by processing channel-interleaved data at high speed. Also, a process delay is reduced. Thus, a high-rate data service can be supported.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method of receiving code symbols corresponding to an interleaved encoder packet (EP), storing the code symbols separately in first, second and third memories, and inputting the stored code symbols to a turbo decoder in a mobile communication system, the method comprising the steps of:
   generating read addresses to read the code symbols according to the size of the EP; and
   reading the code symbols at the read addresses from the memories and outputting the read code symbols to the turbo decoder;
   wherein the generating of the read addresses to read the code symbols comprises:
   generating read address of information symbols in the first memory; and
   generating read address of parity bit symbols in the second and third memory according to the encoder packet size.

2. The method of claim 1, wherein the EP size is one of 408, 792, 1560, 2328, 3096 and 3864 bits.

3. The method of claim 1, wherein the read address generation step comprises the steps of:
   generating memory select signals RAM_SEL using a decoder index DEC_IDX identifying a constituent decoder of the turbo decoder and a symbol type signal DT_IDC indicating a code symbol type according to the EP size;
   generating temporary read addresses TMP_CS indicating the interleaved positions of the code symbols to be input to the turbo decoder in a subblock to which the code symbols belong; and
   generating the read addresses using RAM_SEL, the EP size and the temporary read addresses.

4. The method of claim 1, further comprising the step of generating chip select signals for the first, second and third memories according to the EP size.

5. The method of claim 1, wherein the chip select signal generation step comprises the steps of:
   generating RAM_SEL using DEC_DX and DT_IDC;
   generating TMP_CS; and generating the chip select signals using RAM_SEL, the EP size and TMP_CS.

6. The method of claim 1, wherein the code symbols are stored at different positions of the first, second and third memories according to the EP size.

7. A data receiving method in a mobile communication system where a transmitter encodes an encoder packet (EP) including information bits and tail bits at a predetermined code rate and subblock-interleaves code symbols of a plurality of encoded subblocks prior to transmission, and a receiver receives the code symbols, stores the code symbols separately in first, second and third memories according to the types of the code symbols, reads the code symbols in a deinterleaving order corresponding to the interleaving, and provides the read code symbols to a turbo decoder having two sequentially operating constituent decoders, the method comprising the steps of:

generating read addresses and chip select signals for the memories using the size of the EP in synchronization to a decoder clock signal; and outputting code symbols to the two constituent decoders according to the read addresses and the chip select signals.

8. The data receiving method of claim 7, wherein the step of generating the read addresses and the chip select signals comprises the steps of:

setting DT_IDC to 0 when a data symbol corresponding to an information bit is output to the turbo decoder and setting DT_IDC to 1 when a tail symbol corresponding to a tail bit is output to the turbo decoder, each time the decoder clock signal is triggered;

generating a temporary address, TMP_ADDR indicating the interleaved position of a code symbol to be output to the turbo decoder in a subblock that the code symbol belongs to;

reading the read addresses using TMP_ADDR the EP size, and RAM_SEL produced by OR-operating DT_JDC and DEC_DX identifying a constituent decoder; and generating the chip select signals using RAM SEL TMP_ADDR, the EP size, and TMP_CS produced by OR-operating DT_IDC and the inverse of DEC_IDX.

9. The data receiving method of claim 8, wherein when the EP size is 10 one of 408, 792 and 1560, the read addresses RAM0_ADDR, RAM1_ADDR and RAM2_ADDR for the first, second and third memories are determined by if RAM_SEL=0 RAM0_ADDR=TMP_ADDR RAM1_ADDR=2.times.TMP_ADDR RAM2$_{13}$ ADDR=2.times.TMP_ADDR else RAM0_ADDR=TMP_ADDR RAM1_ADDR=2.times.TMP_ADDR+1 RAM2_ADDR=2.times.TMP_ADDR+1.

10. The data receiving method of claim 9, wherein the chip select signal RAM0_CS for the first memory is TMP_CS and the chip select signals RAM1$_{13}$ CS and RAM2_CS for the second and third memories are 1.

11. The data receiving method of claim 8, wherein when the EP size is 2328, the read addresses RAM0_ADDR, RAM1_ADDR and RAM2_ADDR for the first, second and third memories are determined by if RAM_SEL=0 RAM0_ADDR=TMP_ADDR RAM1_ADDR=TMP_ADDR RAM2_ADDR=TMP_ADDR+2328 else RAM0_ADDR=TMP_ADDR RAM1_ADDR=TMP_ADDR+2328 RAM2$_{13}$ ADDR=TMP_ADDR.

12. The data receiving method of claim 11, wherein the chip select signals RAM0_CS RAM1_CS and RAM2_CS for the first, second and third memories are determined by RAM0_CS=TMP_CS if (RAM_SEL=1) AND (TMP_ADDR 408) RAM1_CS=0 else RAM1_CS=1 if (RAM_SEL=0) AND (TMP_ADDR 408) RAM2_CS=0 else RAM2_CS=1.

13. The data receiving method of claim 8, wherein when the EP size is 3096 or 3864, the read addresses RAM0_ADDR, RAM1_ADDR and RAM2_ADDR for the first, second and third memories are all determined as 1.

14. The data receiving method of claim 13, wherein the chip select signals RAM0_CS RAM1$_{13}$ CS and RAM2_CS for the first, second and third memories are determined by RAM0_CS=TMP_CS if (RAM_SEL=0) AND (TH_OUT=0) RAM1_CS=1 else RAM1_CS=0 if (RAM_SEL=1) AND (TH_OUT=0) RAM2_CS=1 else RAM1_CS=O if (RAM_SEL=1) and (TH_OUT=0) RAM2_CS=1 else RAM2_CS=0where TH_OUT is 1 if TMP_ADDR is equal to or greater than a predetermined threshold, TH_OUT is 0 if TMP_ADDR is less than the threshold, the threshold is 2352 if the EP size is 3096, and the threshold is 1968 if the EP size is 3864.

15. The data receiving method of claim 7, wherein when the EP size is one of 408, 792 and 1560, or when the EP size is one of 2328, 3096 and 3864 and data symbols are input to the first constituent decoder, three code symbols SYS_DATA, PA0_DATA and PA1_DATA input to the first constituent decoder are determined by if RAM0_CS =1 SYS_DATA=RAM0_DATA else SYS_DATA=0 if RAM1_CS=1 PA0_DATA=RAM1_DATA else PA0_DATA=0 if RAM2_CS=1 PA1_DATA=RAM2_DATA else PA1_DATA=0 where RAMx_DATA is a code symbol read at RAMx_ADDR in a (x+1)th memory.

16. The data receiving method of claim 7, wherein when the EP size is one of 2328, 3096 and 3864 and data symbols or tail symbols are input to the second constituent decoder, or when tail symbols are input to the first constituent decoder, three code symbols SYS_DATA, PA0_DATA and PA1_DATA input to the first or second constituent decoder are determined by if RAM0_CS=1 SYS_DATA=RAM0_DATA else SYS_DATA=0 if RAM1_CS=1 PA0_DATA=RAM2_DATA else PA0_DATA=0 if RAM2_CS=1 PA1_DATA=RAM1_DATA else PA1_DATA=0 where RAMx_DATA is a code symbol read at RAMx_ADDR in a (x+1)th memory.

17. An apparatus for receiving code symbols corresponding to an interleaved encoder packet (EP), storing the code symbols separately in first, second and third memories, and inputting the stored code symbols to a turbo decoder in a mobile communication system, the apparatus comprising:

a memory unit having the first, second and third memories, for storing the received code symbols separately as information symbols and parity symbols according to the size of the EP; and a read address generator for generating read addresses to read the code symbols from the first, second and third memories according to the size of the EP, wherein the read address generator comprises:

an input address generator for generating the read addresses of the stored code symbols; and a chip select signal generator for generating select signals for the first, second and third memories.

18. The apparatus of claim 17, wherein the input address generator comprises: means for generating the chip select signal RAM_SEL using a decoder index DEC_IDX identifying a constituent decoder of the turbo decoder and a symbol type signal DT_IDC indicating the type of the code symbol to be read according to a EP size;

means for generating a temporary read address TMP_ADDR indicating the interleaved position of the code symbol to be read in a subblock to which the code symbol belongs; and means for generating the read addresses using RAM_SEL, TMP_ADDR and the EP size.

19. The apparatus of claim 17 wherein the chip select signal generator comprises:

means for generating RAM_SEL using DEC_IDX and DT_IDC;

means for generating TMP_ADDR; means for generating a temporary chip select signal TMP_CS using DT_IDC and DEC_IDX; and means for generating the read address using RAM_SEL, TMP_CS, TMP ADDR and the EP size.

20. The apparatus of claim 17 wherein the memory unit further comprises:
a zero inserter for outputting zero symbols according to a chip select signal instead of stored code symbols; and
a switch for switching parity symbols according to the EP size and a chip select signal.

21. The apparatus of claim 19, wherein when the EP size is one of 408, 792 and 1560, the read addresses RAM0_ADDR, RAM1_ADDR and RAM2_ADDR for the first, second and third memories are determined by if RAM_SEL=0 RAM0_ADDR=TMP_ADDR RAM1_ADDR=2.times.TMP_ADDR RAM2_ADDR=2.times.TMP_ADDR else RAM0_ADDR=TMP_ADDR RAM1_ADDR=2.times.TMP_ADDR+1 RAM2_ADDR=2.times.TMP_ADDR+1.

22. The apparatus of claim 21, wherein the chip select signal RAM0_CS for the first memory is TMP_CS and the chip select signals RAM1_CS and RAM2_CS for the second and third memories are 1.

23. The apparatus of claim 19, wherein when the EP size is 2328, the read addresses RAM0_ADDR, RAM1_ADDR and RAM2_ADDR for the first, second and third memories are determined by if RAM_SEL=0 RAM0_ADDR=TMP_ADDR RAM1_ADDR=TMP_ADDR RAM2_ADDR=TMP_ADDR 2328 else RAM0_ADDR=TMP_ADDR RAM1 ADDR=TMP_ADDR2328 RAM2_ADDR=TMP_ADDR.

24. The apparatus of claim 19, wherein the chip select signals RAM0_CS, RAM1_CS and RAM2_CS for the first, second and third memories are determined by RAM0_CS=TMP_CS if (RAM_SEL=1) AND (TMP_ADDR 408) RAM1_CS=0 else RAM1_CS=1 if (RAM_SEL=0) AND (TMP_ADDR 408) RAM2_CS=0 else RAM2_CS=1.

25. The apparatus of claim 19, wherein when the EP size is 3096 or 3864, the read addresses RAM0_ADDR, RAM1_ADDR and RAM2_ADDR for the first, second and third memories are all determined as 1.

26. The apparatus of claim 25, wherein the chip select signals RAM0_CS, RAM1_CS and RAM2_CS for the first, second and third memories are determined by RAM0_CS=TMP_CS if (RAM_SEL=0) AND (TH_OUT=0) RAM1_CS=1 else RAM1_CS=0 if (RAM_SEL=1) AND (TH_OUT=0) RAM2_CS=1 else RAM2_CS=0 where TH_OUT is 1 if TMP_ADDR is equal to or greater than a predetermined threshold, TH_OUT is 0 if TMP_ADDR is less than the threshold, the threshold is 2352 if the EP size is 3096, and the threshold is 1968 if the EP size is 3864.

27. The apparatus of claim 19, wherein when the EP size is one of 408, 792 and 1560, or when the EP size is one of 2328, 3096 and 3864 and data symbols corresponding to an information bit are input to the first constituent decoder, three code symbols SYS_DATA, PA0_DATA and PA1_DATA input to the first constituent decoder are determined by if RAM0_CS=1SYS_DATA=RAM_DATA else SYS_DATA=0 if RAM_CS=1 PA0_DATA=RAM1_DATA else PA0_DATA=0 if RAM2_CS=1 PA1_DATA=RAM2_DATA else PA1_DATA=0 where RAMx_DATA is a code symbol read at RAMx_ADDR in a (x+1)th memory.

28. The apparatus of claim 19, wherein when the EP size is one of 2328, 3096 and 3864 and data symbols or tail symbols are input to the second constituent decoder, or when tail symbols are input to the first constituent decoder, three code symbols SYS_DATA, PA0_DATA and PA1_DATA input to the first or second constituent decoder are determined by if RAM0_CS=1 SYS_DATA=RAM0_DATA else SYS_DATA=0 if RAM1_CS=1 PAO_DATA=RAM2_DATA else PA0_DATA=0 if RAM2_CS=1 PA1_DATA=RAM1_DATA else PA1_DATA=0 where RAMx_DATA is a code symbol read at RAMx_ADDR in a (x+1)th memory.

29. A data receiving apparatus in a mobile terminal having a turbo decoder, comprising:
an antenna for receiving a radio frequency (RF) signal from a transmitter, the RF signal corresponding to an encoder packet (HP);
a baseband converter for downconverting the RH signal to a baseband signal; an analog-to-digital converter for converting the baseband signal to a digital signal; a demodulator for demodulating the digital signal and outputting code symbols;
a memory unit having first, second and third memories, for storing the code symbols separately in the first, second and third memories according to the types of the code symbols and selecting code symbols as a turbo decoder input; and
a memory controller for generating read addresses to read code symbols from the first, second and third memories according to the types of the code symbols.

30. The data receiving apparatus of claim 29, wherein the memory controller comprises:
an read address generator for generating the read address of a code symbol; and
a chip select signal generator for generating a chip select signal to select one of the first, second and third memories.

31. The data receiving apparatus of claim 30, wherein the read address generator comprises:
means for generating the chip select signal RAM_SEL using a decoder index DEC_IDX identifying a constituent decoder of the turbo decoder and a symbol type signal DT_IDC indicating the type of the code symbol to be read according to a EP size;
means for generating a temporary read address TMP_ADDR indicating the interleaved position of the code symbol to be read in a subblock to which the code symbol belongs; and
means for generating the read addresses using RAM_SEL, TMP_ADDR and the EP size.

32. The data receiving apparatus of claim 30, wherein the chip select signal generator comprises:
means for generating RAM_SEL using DEC_IDX and DT_IDC means for generating TMP_ADDR;
means for generating a temporary chip select signal TMP_CS using DT_IDC and DEC_IDX; and
means for generating the read address using RAM_SEL, TMP_CS, TMP ADDR and a EP size.

33. The data receiving apparatus of claim 29, wherein the memory unit further comprises:
a zero inserter for outputting a zero symbol instead of the stored code symbol according to the chip select signal; and
a switch for selecting a parity symbol according to a EP size and the chip select signal.

34. The data receiving apparatus of claim 29, wherein the code symbol types are information symbols and parity symbols.

35. A data receiving method in a mobile terminal having a turbo decoder, comprising the steps of:
- receiving a radio frequency (RF) signal from a transmitter, the RF signal corresponding to an encoder packet (EP);
- down-converting the RF signal to a baseband signal; converting the baseband signal to a digital signal;
- demodulating the digital signal and outputting demodulated code symbols;
- storing the code symbols separately in the first, second and third memories according to the types of the code symbols;
- generating read addresses to read code symbols as a turbo decoder input from the first, second and third memories according to the type of the code symbols.

36. The data receiving method of claim 35, further comprises the step of generating a chip select signal to select one of the first, second and third memories.

37. The data receiving method of claim 36, wherein the read address generation step comprises the steps of:
- generating the chip select signal RAM_SEL using a decoder index DEC_IDX identifying a constituent decoder of the turbo decoder and a symbol type signal DT_IDC indicating the type of the code symbol to be read according to a EP size;
- generating a temporary read address TMP_ADDR indicating the interleaved position of the code symbol to be read in a subblock to which the code symbol belongs; and
- generating the read addresses using RAM_SEL, TMP_ADDR and the EP size.

38. The data receiving method of claim 36, wherein the chip select signal generation step comprises the steps of:
- generating RAM_SEL using DEC_IDX and DT_IDC;
- generating TMP_ADDR;
- generating a temporary chip select signal TMP_CS using DT_IDC and DEC_IDX; and
- generating the read address using RAM_SEL, TMP_CS, TMP_ADDR and a EP size.

39. The data receiving method of claim 36, further comprising the steps of: outputting a zero symbol instead of the stored code symbol according to the chip select signal; and selecting a parity symbol according to a EP size and the chip select signal.

40. The data receiving method of claim 35, wherein the code symbol types are information symbols and parity symbols.

* * * * *